United States Patent
Khaderbad et al.

(10) Patent No.: US 11,380,781 B2
(45) Date of Patent: Jul. 5, 2022

(54) CONTACT AND VIA STRUCTURES FOR SEMICONDUCTOR DEVICES

(71) Applicant: Taiwan Semiconductor Manufacturing Co., Ltd., Hsinchu (TW)

(72) Inventors: Mrunal A. Khaderbad, Hsinchu (TW); Keng-Chu Lin, Ping-Tung (TW)

(73) Assignee: Taiwan Semiconductor Manufacturing Co., Ltd.

( * ) Notice: Subject to any disclaimer, the term of this patent is extended or adjusted under 35 U.S.C. 154(b) by 72 days.

(21) Appl. No.: 16/717,600

(22) Filed: Dec. 17, 2019

(65) Prior Publication Data
US 2021/0184018 A1    Jun. 17, 2021

(51) Int. Cl.
*H01L 29/66* (2006.01)
*H01L 29/417* (2006.01)
*H01L 29/78* (2006.01)
*H01L 21/8234* (2006.01)
*H01L 21/768* (2006.01)
*H01L 29/40* (2006.01)

(52) U.S. Cl.
CPC .. *H01L 29/66795* (2013.01); *H01L 21/76805* (2013.01); *H01L 21/76831* (2013.01); *H01L 21/76877* (2013.01); *H01L 21/823418* (2013.01); *H01L 21/823431* (2013.01); *H01L 29/401* (2013.01); *H01L 29/41791* (2013.01); *H01L 29/7851* (2013.01)

(58) Field of Classification Search
CPC ............ H01L 21/76805; H01L 21/76831
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2017/0222008 A1* | 8/2017 | Hsu ................ H01L 21/76802 |
| 2019/0355672 A1* | 11/2019 | Fujita .............. H01L 27/11524 |
| 2020/0303559 A1* | 9/2020 | Huang ............... H01L 21/0228 |

OTHER PUBLICATIONS

D. Gall et. al., "Electron mean free path in elemental metals." J. Appl. Phys. 119, 085101 (2016).

* cited by examiner

*Primary Examiner* — Farun Lu
(74) *Attorney, Agent, or Firm* — Sterne, Kessler, Goldstein & Fox P.L.L.C.

(57) ABSTRACT

The structure of a semiconductor device with source/drain contact structures and via structures and a method of fabricating the semiconductor device are disclosed. A method for fabricating a semiconductor device includes forming a source/drain (S/D) region on a substrate, forming a S/D contact structure on the S/D region, and forming a via structure on the S/D contact structure. The forming of the via structure includes forming a via opening on the S/D contact structure, forming a non-metal passivation layer on sidewalls of the via opening, and depositing a via plug within the via opening in a bottom-up deposition process.

20 Claims, 13 Drawing Sheets

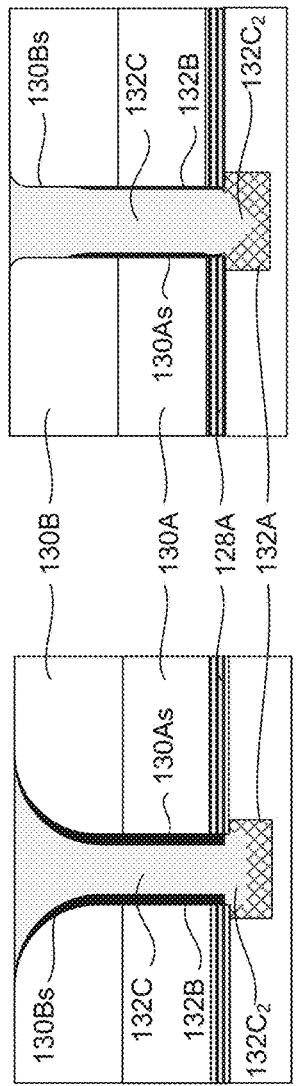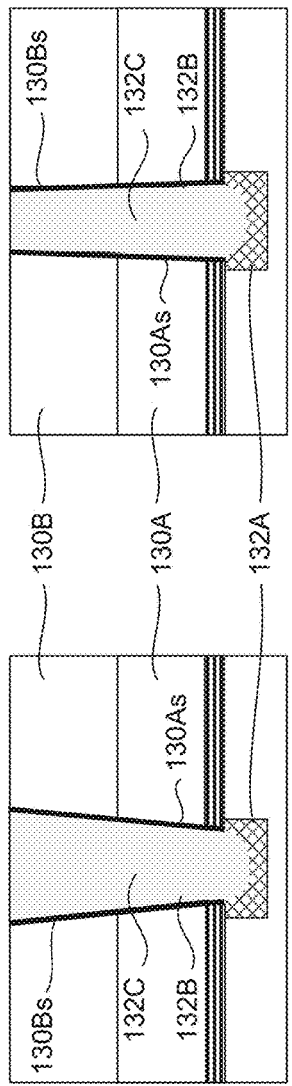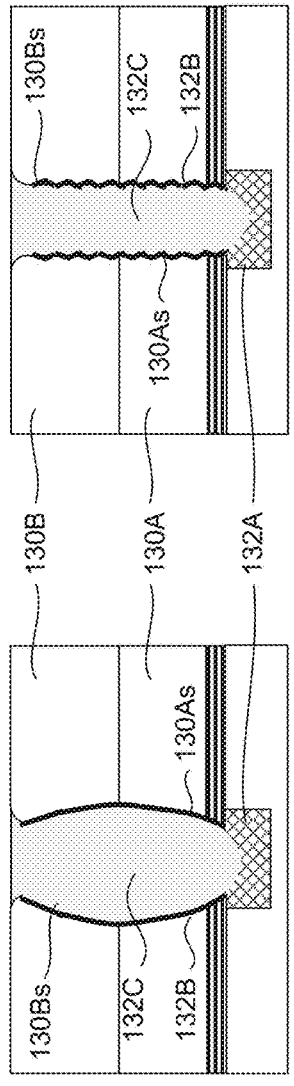

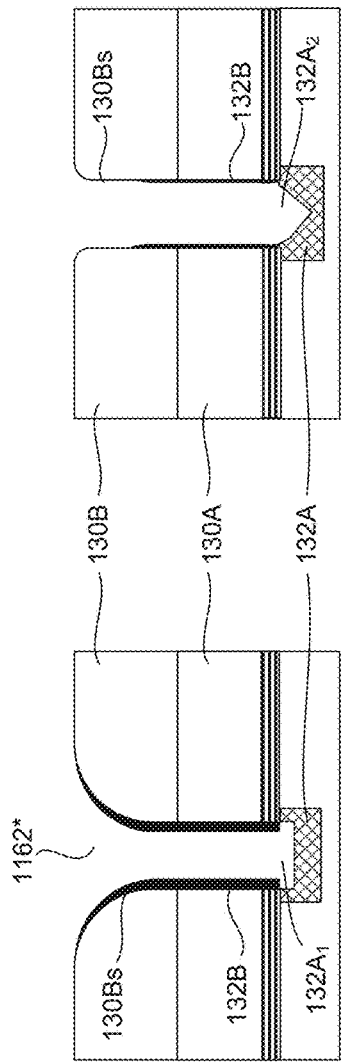
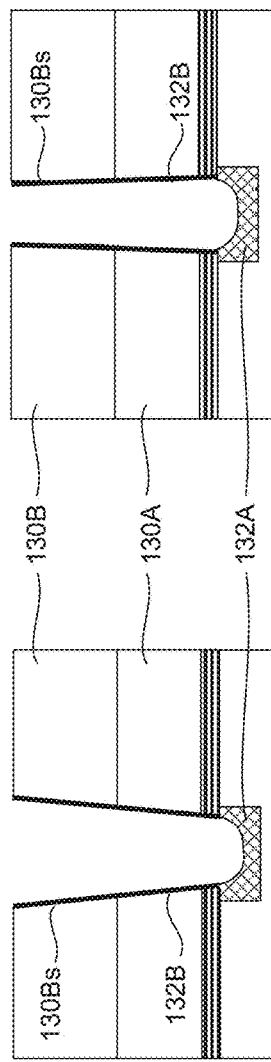
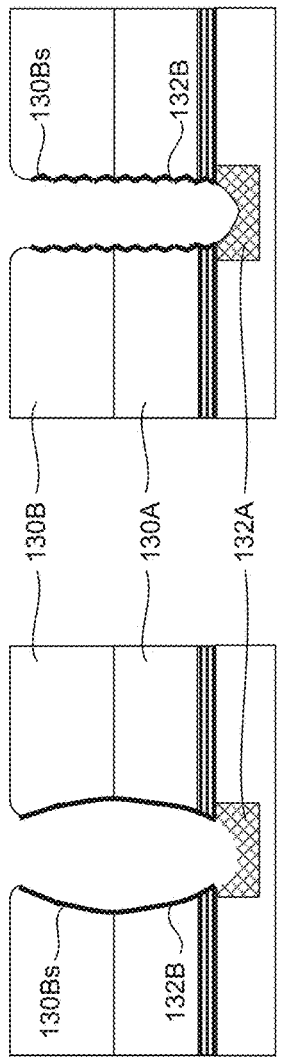

CONTACT AND VIA STRUCTURES FOR SEMICONDUCTOR DEVICES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 2A-2F illustrate cross-sectional views of different configurations of a source/drain contact structure, in accordance with some embodiments.

FIGS. 19A-19F illustrate cross-sectional views of a source/drain contact structure at a stage of its fabrication process, in accordance with some embodiments Illustrative embodiments will now be described with reference to the accompanying drawings. In the drawings, like reference numerals generally indicate identical, functionally similar, and/or structurally similar elements.

DETAILED DESCRIPTION

Figure 1A:
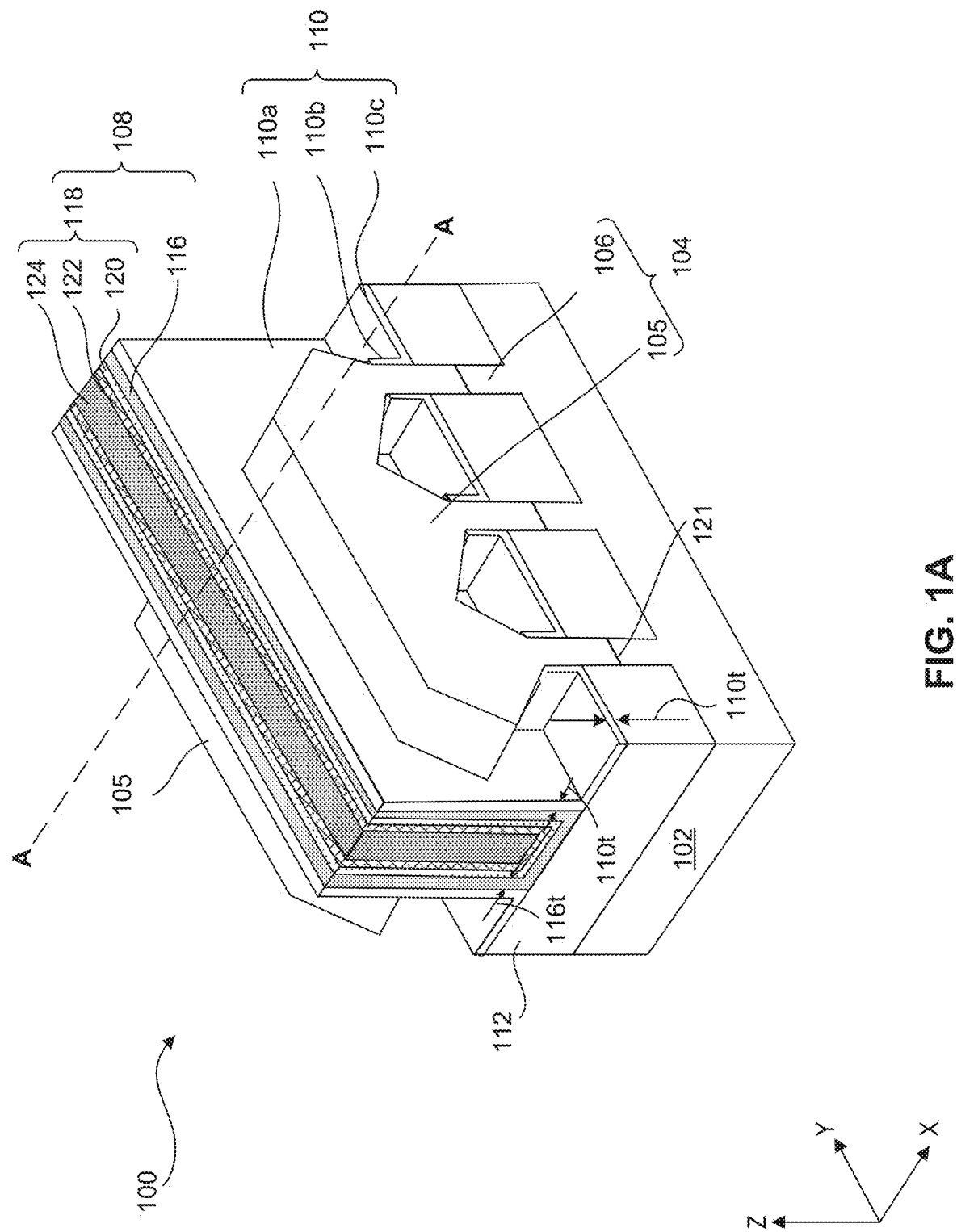
FIGS. 1A-1B illustrate an isometric view and a cross-sectional view of a fin field effect transistor (finFET), respectively, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "etch selectivity" refers to the ratio of the etch rates of two different materials under the same etching conditions.

As used herein, the term "deposition selectivity" refers to the ratio of the deposition rates on two different materials or surfaces under the same deposition conditions.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

In some embodiments, the terms "about" and "substantially" can indicate a value of a given quantity that varies within 5% of the value (e.g., ±1%, ±2%, ±3%, ±4%, ±5% of the value).

The fin structures disclosed herein may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example structures and methods for reducing resistivity of contact plugs in source/drain (S/D) contact structures and/or via plugs in via structures of FET devices (e.g., finFETs, gate-all-around FETs, MOSFETs, etc.). The reduction of contact and/or via plug resistivity in FET devices can reduce the contact resistance between S/D regions, S/D contact structures, and interconnect structures (e.g., conductive lines, vias structures, etc.), thus resulting in higher drive currents in the FET devices with improved FET device performance.

The scaling down of FET devices has increased the complexity of fabricating contact and/or via plugs with low resistivity (e.g., resistivity about 50 $\mu\Omega$-cm, about 40 $\mu\Omega$-cm, about 30 $\mu\Omega$-cm, about 20 $\mu\Omega$-cm, or about 10 $\mu\Omega$-cm) in respective contact and/or via openings with dimensions (e.g., width or diameter) less than about 20 nm (e.g., about 15 nm, about 12.5 nm, about 10 nm, about 7.5 nm, about 5 nm, or about 2 nm). One of the challenges of fabricating contact and/or via plugs in such small dimensions of contact and/or via openings can be the fabrication of void-free contact and/or via plugs. The presence of voids in contact and/or via plugs can increase their resistivity, and as a result increase the contact resistance between S/D regions, S/D contact structures, and interconnect structures.

The example structures and methods provide contact and via structures with substantially void-free contact and via plugs, respectively. The substantially void-free contact and via plugs can be formed with low resistivity (e.g., resistivity about 50 $\mu\Omega$-cm, about 40 $\mu\Omega$-cm, about 30 $\mu\Omega$-cm, about 20 $\mu\Omega$-cm, or about 10 $\mu\Omega$-cm) in respective contact and/or via openings with dimensions (e.g., width or diameter) less than about 20 nm (e.g., about 15 nm, about 12.5 nm, about 10 nm, about 7.5 nm, about 5 nm, or about 2 nm) and with high aspect ratio (e.g., about 10, about 15, about 20, or about 30). The aspect ratio of the contact and/or via openings can be a ratio of their vertical dimensions (e.g., height) to their horizontal dimensions (e.g., width or diameter).

In some embodiments, the contact plugs can include low-resistivity metals, such as ruthenium (Ru), iridium (Ir), nickel (Ni), Osmium (Os), rhodium (Rh), aluminum (Al), molybdenum (Mo), tungsten (W), or cobalt (Co). In some embodiments, the via plugs can include low-resistivity metals, such as Ru, Co, Ni, Al, Mo, W, Ir, Os, copper (Cu), or platinum (Pt). In some embodiments, Ru-based contact and/or via plugs with dimensions less than about 20 nm (e.g., about 15 nm, about 12.5 nm, about 10 nm, about 7.5 nm, about 5 nm, or about 2 nm) can have lower resistivity compared to copper (Cu), W, or Co-based contact and/or via plugs with similar dimensions.

In some embodiments, the contact and via structures can be formed without metal-based barrier layers (also referred to as adhesion layers or liners) along the sidewalls of respective contact and via openings to reduce contact and/or via plug resistivity, respectively. Barrierless contact and/or via structures can have larger volume for the formation of respective contact and/or via plugs. Larger volume can allow the contact and/or via plugs to have larger cross-sectional areas in the respective contact and/or via structures, which can lead to reduced contact and/or via plug resistivity because resistivity of a material is inversely proportional to the cross-sectional area of the material. Also, the larger cross-sectional areas result in larger contact areas with S/D regions, thus resulting in reduced contact resistance between S/D regions, S/D contact structures, and interconnect structures.

In some embodiments, the method for fabricating the substantially void-free contact and/or via plugs in respective barrierless contact and/or via structures can include passivating the sidewalls of respective contact and via openings with non-metal-based passivation layers to inhibit deposition of the contact and/or via plug materials along the respective contact and via opening sidewalls and promote their bottom-up deposition. Passivation layers can also prevent diffusion of the contact and/or via plug materials to adjacent layers. To promote the bottom-up deposition of the contact and/or via plug materials, the method can further include directional etching of metal oxides from surfaces of metal-based layers (e.g., metal silicide layers or S/D contact plugs) on which the contact and/or via plug materials can be deposited. This directional etching of metal oxides can increase the deposition selectivity of the contact and/or via plug materials to these substantially oxide-free metal-based layers than to the contact and via opening sidewalls.

In some embodiments, the substantially void-free contact and via plugs can be formed in contact and via structures with metal-based barrier layers along the sidewalls of contact and via openings, respectively, using the bottom-up deposition process. The method for forming such contact and/or via structures can include oxidizing at least the surfaces of the metal-based barrier layers to decrease the deposition selectivity of the contact and/or via plug materials to the contact and/or via opening sidewalls, respectively, and prevent their conformal deposition within the respective contact and/or via openings. Thus, the example methods disclosed herein can form substantially void-free contact and via plugs with low resistivity in respective contact and via structures with or without metal-based barrier layers using the bottom-up deposition process.

Though the present disclosure describes contact structures (e.g., S/D and/or gate contact structures) and via structures of a finFET (e.g., finFET 100), the contact and via structures and the method for forming these structures described herein can be applied to other FETs, such as gate-all-around (GAA) FETs and MOSFETs.

FIG. 1A illustrates an isometric view of a finFET 100, according to some embodiments. The isometric view of finFET 100 is shown for illustration purposes and may not be drawn to scale. FinFET 100 can be formed on a substrate 102 and can include a fin structure 104, a gate structure 108 disposed on fin structure 104, spacers 110 disposed on opposite sides of gate structure 108, and shallow trench isolation (STI) regions 112. Though FIG. 1 shows one gate structure 108, finFET 100 can include one or more gate structures similar and parallel to gate structure 108.

Substrate 102 can be a semiconductor material such as, but not limited to, silicon. In some embodiments, substrate 102 includes a crystalline silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic).

Fin structure 104 represent current carrying structures of finFET 100 and can traverse along an X-axis and through gate structure 108. Fin structure 104 can include: (i) epitaxial fin regions 105 disposed on opposing sides of gate structure 108; and (ii) fin regions 106 underlying epitaxial fin regions 105 and gate structure 108. Epitaxial fin regions 105 can form source/drain (S/D) regions 105 of finFET 100 and the portions of fin regions 106 underlying gate structure 108 can form the channel regions (not shown) of finFET 100. Fin regions 106 can be formed from patterned portions of substrate 102 and form interfaces 121 with epitaxial regions 104. In some embodiments, interfaces 121 can be coplanar with top surface of STI regions 112 or top surface of substrate 102. Though finFET 100 is shown to have merged epitaxial fin region 105 on three fin regions 106, finFET 100 can have an individual epitaxial fin region similar in composition to epitaxial fin region 105 on each fin region 106.

Each of epitaxial fin regions 105 can include an epitaxially-grown semiconductor material. In some embodiments, the epitaxially grown semiconductor material is the same material as the material of substrate 102. In some embodiments, the epitaxially-grown semiconductor material can include a different material from the material of substrate 102. The epitaxially-grown semiconductor material can include: (i) a semiconductor material, such as germanium or silicon; (ii) a compound semiconductor material, such as gallium arsenide and/or aluminum gallium arsenide; or (iii) a semiconductor alloy, such as silicon germanium and/or gallium arsenide phosphide. In some embodiments, the epitaxially grown semiconductor material In some embodiments, epitaxial fin regions 105 can be grown by (i) chemical vapor deposition (CVD), such as low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial fin regions 105 can be grown by an epitaxial deposition/partial etch process, which repeats the epitaxial deposition/partial etch process at least once. Such repeated deposition/partial etch process is also called a cyclic deposition-etch (CDE) process. In some embodiments, epitaxial fin regions 105 can be grown by selective epitaxial growth (SEG), where an etching gas is added to promote the selective growth of semiconductor material on the exposed surfaces of fin regions 106, but not on insulating material (e.g., dielectric material of STI regions 112).

Each of epitaxial fin regions 105 can be p-type or n-type. Each of p-type epitaxial fin regions 105 can include SiGe, Si, silicon germanium bromide (SiGeB), Ge or III-V materials (e.g., indium antimonide (InSb), gallium antimonide (GaSb), or indium gallium antimonide (InGaSb)) and can be in-situ doped during an epitaxial growth process using p-type dopants, such as boron, indium, or gallium. For p-type in-situ doping, p-type doping precursors, such as diborane ($B_2H_6$), boron trifluoride ($BF_3$), and/or other p-type doping precursors, can be used Each of p-type epitaxial regions 105 can include epitaxially grown p-type first, second, and third sub-regions (not shown), where the third sub-region can be grown on the second sub-region, and the second sub-region can be grown on the first sub-region. In some embodiments, the sub-regions can have SiGe and differ from each other based on, for example, doping concentration, epitaxial growth process conditions, and/or relative concentration of Ge with respect to Si. For example, the atomic percent Ge in the first sub-region can be less than the atomic percent Ge in the second sub-region and greater than the atomic percent Ge in third sub-region. In some embodiments, the atomic percent Ge in the first sub-region can be equal to the atomic percent Ge in the second sub-region, but greater than the atomic percent Ge in the third sub-region. In some embodiments, the first sub-region can include Ge in a range from 15 atomic percent to 35 atomic percent, while the second sub-region can include Ge in a range from 35 atomic percent to 70 atomic percent and the third sub-region can include less than about 25 atomic percent Ge with any remaining atomic percent being Si in the sub-regions.

The sub-regions can be epitaxially grown under a pressure of 10 Torr to 300 Torr, at a temperature of 500° C. to 700° C. using reaction gases, such as HCl as an etching agent, GeH4 as Ge precursor, dichlorosilane (DCS) and/or SiH4 as Si precursor, B2H6 as B dopant precursor, H2, and/or N2. To achieve different concentration of Ge in the sub-regions, the ratio of a flow rate of Ge to Si precursors may be varied during their respective growth process. For example, a Ge to Si precursor flow rate ratio in a range from 9 to 25 can be used during the epitaxial growth of the second sub-region, while a Ge to Si precursor flow rate ratio less than about 6 can be used during the epitaxial growth of the third sub-region.

The sub-regions can have varying dopant concentration with respect to each other. For example, the first sub-region can be undoped or can have a dopant concentration lower than the dopant concentrations of the second and third sub-regions. In some embodiments, the first sub-region can have a dopant concentration less $5\times10^{20}$ atoms/cm$^3$, while the second sub-region can have a dopant concentration in a range from $1\times10^{20}$ to $2\times10^{21}$ atoms/cm$^3$ and the third sub-region can have a dopant concentration in a range from $1\times10^{20}$ to $3\times10^{21}$ atoms/cm$^3$.

In some embodiments, each of n-type epitaxial fin regions 105 can include Si, silicon phosphide (SiP), silicon carbide (SiC), silicon phosphorus carbide (SiPC), or III-V materials (e.g., indium phosphide (InP), gallium arsenide (GaAs), aluminum arsenide (AlAs), indium arsenide (InAs), indium aluminum arsenide (InAlAs), or indium gallium arsenide (InGaAs)) and can be in-situ doped during an epitaxial growth process using n-type dopants, such as phosphorus or arsenic. For n-type in-situ doping, n-type doping precursors, such as phosphine ($PH_3$), arsine ($AsH_3$), and/or other n-type doping precursor, can be used. Each of epitaxial fin regions 105 can have multiple n-type sub-regions. Except for the type of dopants, the n-type sub-regions can be similar to the p-type sub-regions, in thickness, relative Ge concentration with respect to Si, dopant concentration, and/or epitaxial growth process conditions. Other materials, thicknesses, Ge concentrations, and dopant concentrations for the n-type and/or p-type sub-regions are within the scope and spirit of this disclosure.

Gate structures 108 can include a gate dielectric layer 116, and a gate electrode 118 disposed on gate dielectric layer 116. Gate structure 108 can be formed by a gate replacement process.

In some embodiments, gate dielectric layer 116 can have a thickness 116t in a range from about 1 nm to about 5 nm.

Gate dielectric layer 116 can include silicon oxide and can be formed by CVD, atomic layer deposition (ALD), physical vapor deposition (PVD), e-beam evaporation, or other suitable processes. In some embodiments, gate dielectric layer 116 can include (i) a layer of silicon oxide, silicon nitride, and/or silicon oxynitride, (ii) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers can be formed by ALD and/or other suitable methods. In some embodiments, gate dielectric layer 116 can include a single layer or a stack of insulating material layers. Other materials and formation methods for gate dielectric layers 116 are within the scope and spirit of this disclosure.

In some embodiments, gate electrode 118 can include a gate barrier layer 120, a gate work function layer 122, and a gate metal fill layer 124. Gate barrier layer 120 can serve as a nucleation layer for subsequent formation of gate work function layer 122 and/or can help to prevent substantial diffusion of metals (e.g., Al) from gate work function layer 122 to underlying layers (e.g., gate dielectric layer 116). Gate barrier layer 120 can include titanium (Ti), tantalum (Ta), titanium nitride (TiN), tantalum nitride (TaN), or other suitable diffusion barrier materials and can be formed by ALD, PVD, CVD, or other suitable metal deposition processes. In some embodiments, gate barrier layer 120 can include substantially fluorine-free metal or metal-containing film and can be formed by ALD or CVD using one or more non-fluorine based precursors. The substantially fluorine-free metal or fluorine-free metal-containing film can include an amount of fluorine contaminants less than 5 atomic percent in the form of ions, atoms, and/or molecules. In some embodiments, gate barrier layer 120 can have a thickness ranging from about 1 nm to about 10 nm. Other materials, formation methods and thicknesses for gate barrier layer 120 are within the scope and spirit of this disclosure.

Gate work function layer 122 can include a single metal layer or a stack of metal layers. The stack of metal layers can include metals having work function values equal to or different from each other. In some embodiments, gate work function layer 122 can include aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. In some embodiments, gate work function layer 122 can include Al-doped metal, such as Al-doped Ti, Al-doped TiN, Al-doped Ta, or Al-doped TaN. Gate work function layer 122 can be formed using a suitable process such as ALD, CVD, PVD, plating, or combinations thereof. In some embodiments, gate work function layer 122 can have a thickness ranging from about 2 nm to about 15 nm. Other materials, formation methods and thicknesses for gate work function layer 122 are within the scope and spirit of this disclosure.

Gate metal fill layer 124 can include a single metal layer or a stack of metal layers. The stack of metal layers can include metals different from each other. In some embodiments, gate metal fill layer 124 can include a suitable conductive material, such as Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof. Gate metal fill layer 124 can be formed by ALD, PVD, CVD, or other suitable deposition processes. Other materials and formation methods for gate metal fill layer 124 are within the scope and spirit of this disclosure.

Each of spacers 110 can include spacer portions 110a that form sidewalls of gate structure 108 and are in contact with dielectric layer 116, spacer portions 110b that form sidewalls of fin structure 104, and spacer portions 110c that form protective layers on STI regions 112. Spacers 110 can include insulating material, such as silicon oxide, silicon nitride, a low-k material, or a combination thereof. Spacers 110 can have a low-k material with a dielectric constant less than 3.9 (e.g., less than 3.5, 3, or 2.8). In some embodiments, each of spacers 110 can have a thickness 110t in a range from about 7 nm to about 10 nm. Based on the disclosure herein, a person of ordinary skill in the art will recognize that other materials and thicknesses for spacers 110 are within the scope and spirit of this disclosure.

STI regions 112 can provide electrical isolation to finFET 100 from neighboring active and passive elements (not shown) integrated with or deposited onto substrate 102. STI regions 112 can have a dielectric material, such as silicon oxide, silicon nitride, silicon oxynitride, fluorine-doped silicate glass (FSG), a low-k dielectric material, and/or other suitable insulating materials. In some embodiments, STI regions 112 can include a multi-layered structure.

FinFET 100 can include additional elements, such as etch stop layer (ESL) 128A-128B, interlayer dielectric layers (ILD) 130A-130C, S/D contact structures 132, gate contact structures 133, and via structures 134, which are illustrated and described with reference to FIG. 1B, a cross-sectional view along line A-A of finFET 100 of FIG. 1A. These additional elements are not shown in FIG. 1A for the sake of clarity.

ESL 128A can be configured to protect gate structure 108 and S/D regions 105. This protection can be provided, for example, during the formation of ILD layer 130A and/or S/D contact structures 132. ESL 128A can be disposed on sides of spacers 110 and on S/D regions 105. In some embodiments, ESL 128A can include, for example, silicon nitride ($SiN_x$), silicon oxide ($SiO_x$), silicon oxynitride (SiON), silicon carbide (SiC), silicon carbo-nitride (SiCN), boron nitride (BN), silicon boron nitride (SiBN), silicon carbon boron nitride (SiCBN), silicon nitride (SiN), silicon oxycarbide (SiOC), silicon oxycarbonitride (SiOCN), or a combination thereof. In some embodiments, ESL 128A can include silicon nitride or silicon oxide formed by low pressure chemical vapor deposition (LPCVD), plasma enhanced chemical vapor deposition (PECVD), chemical vapor deposition (CVD), or silicon oxide formed by a high-aspect-ratio process (HARP). In some embodiments, ESL 128A can have a thickness along a Z-axis in a range from about 1 nm to about 10 nm (e.g., about 1 nm, about 3 nm, about 5 nm, or about 10 nm).

ESL 128B can be similar in composition to ESL 128A, according to some embodiments. In some embodiments, ESL 128B can have a thickness along a Z-axis different from thickness of ESL 128A in a range from about 5 nm to about 10 nm. ESL 128B can be disposed on ILD layer 130B and S/D contact structures 132. Other materials, formation methods, and thicknesses for ESLs 128A-128B are within the scope and spirit of this disclosure.

ILD layer 130A can be disposed on ESL 128A and can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using flowable CVD (FCVD). In some embodiments, the dielectric material can be silicon oxide. In some embodiments, ILD layer 130A can include silicon oxide ($SiO_2$), SiOC, zirconium oxide ($ZrO_2$), hafnium oxide ($HfO_2$), or dielectric materials with high-k, low-k (e.g., k-value in a range from about 3.9 to about 3.0), or extreme low-k (e.g., k-value in a range from about 2.9 to about 2.0). In some embodiments, ILD layer 130A can have a thickness along a Z-axis in a range from about 50 nm to about 200 nm. In some embodiments, ILD layer 130A can include a stack of dielectric layers, where each dielectric layer can have thickness along a Z-axis in a range from about 1 nm to about 10 nm (e.g., about 1 nm, about 3 nm, about 5 nm, or about 10 nm).

ILD layer 130B can be disposed on ILD 130A and can have a thickness along a Z-axis in a range from about 500 nm to about 600 nm. ILD layer 130C can be disposed on ESL 128B and can have a thickness along a Z-axis in a range from about 500 nm to about 600 nm. In some embodiments, ILD layers 130B-130C can be similar in composition to ILD layer 130A. In some embodiments, ILD layer 130B can include a dielectric material, such as silicon oxycarbide, TEOS oxide, or a combination thereof. In some embodiments, ILD layer 130C can include a low-k dielectric material having a k value less than about 3.0 (e.g., about 2.8 or about 2.5). Other materials, thicknesses, and formation methods for ILD layers 130A-130C are within the scope and spirit of this disclosure.

S/D contact structures 132 can be configured to electrically connect S/D regions 105 to other elements of finFET 100 and/or of the integrated circuit (not shown). S/D contact structures 132 can be disposed on and in electrical contact with S/D regions 105. In some embodiments, each of S/D contact structures 132 can include (i) a silicide layer 132, (ii) a passivation layer 132B, and (iii) a S/D contact plug 132C.

Silicide layers 132A can be disposed on or within S/D regions 105 and can have a thickness along a Z-axis in a range from about 2 nm to about 10 nm (e.g., about 2 nm, about 4 nm, about 6 nm, about 8 nm, or about 10 nm). Silicide layers 132A can provide a low resistance interface between S/D regions 105 and S/D contact plugs 132C. Silicide layer 132A can include Co, Ni, Ti, W, Mo, Ti, nickel cobalt alloy (NiCo), Pt, nickel platinum alloy (NiPt), Ir, platinum iridium alloy (PtIr), Er, Yb, Pd, Rh, niobium (Nb), titanium silicon nitride (TiSiN), other refractory metals, or a combination thereof. In some embodiments, silicide layers 132A can include a metal silicide-dopant complex material that can be formed from dopants included during the formation of silicide layers 132A. Silicide layers 132A can have a dopant concentration greater than $10^{21}$ atoms/cm$^3$, $10^{22}$ atoms/cm$^3$, or $10^{23}$ atoms/cm$^3$. For n-type S/D regions 105, dopants in silicide layers 132A can include phosphorus, arsenic, other n-type dopants, or a combination thereof. For p-type S/D regions, dopants in silicide layers 132A B can include indium (In), gallium (Ga), other p-type dopants, or a combination thereof.

Passivation layers 132B can be formed along ILD sidewalls 130As-130Bs as a result of a surface passivation performed on ILD sidewalls 130As-130Bs prior to the bottom-up deposition of S/D contact plugs 132C on silicide layers 132A. The surface passivation can be performed so the surfaces of ILD sidewalls 130As-130B are less favorable to the deposition of S/D contact plug materials (e.g., metals or metal alloys) of S/D contact plugs 132C. The S/D contact plug materials can be inhibited from depositing along ILD sidewalls 130As-130Bs because the material composition of passivation layers 132B can provide a less favorable surface than ILD sidewalls 130As-130Bs for the adhesion of S/D contact plug materials, thus decreasing the deposition selectivity of the S/D contact plug materials to ILD sidewalls 130As-130Bs.

The passivation material composition of passivation layers 132B can depend on the one or more passivation and etching gases used during their formation and on the composition of ILD layers 130A-130B. When passivation layers 132B are formed with oxygen-containing passivation gases and fluorine-containing etching gases (e.g., sulfur hexafluoride ($SF_6$), tungsten hexafluoride ($WF_6$), nitrogen trifluoride ($NF_3$), mixture of NF3 and hydrogen fluoride (HF), or chlorine trifluoride ($ClF_3$)), passivation layers 132B can include an oxygen-rich material composition. The oxygen-rich material composition can include (i) oxygen concentration in a range from about 1 atomic percent to about 50 atomic percent (e.g., about 1 atomic percent, about 5 atomic percent, about 10 atomic percent, about 25 atomic percent, or about 50 atomic percent), (ii) nitrogen concentration in a range from about 2 atomic percent to about 20 atomic percent (e.g., about 2 atomic percent, about 5 atomic percent, about 10 atomic percent, about 15 atomic percent, or about 20 atomic percent), and (iii) fluorine concentration in a range from about 1 atomic percent to about 20 atomic percent (e.g., about 1 atomic percent, about 5 atomic percent, about 10 atomic percent, about 15 atomic percent, or about 20 atomic percent). In some embodiments, the oxygen-rich material composition can include $SiN_zO_xF_y$ or $[A]O_xF_y$, where [A] can be elements of ILD layers 130A and/or 130B, such as Si, SiC, metal oxides (e.g., aluminum oxide (Al2O3) or magnesium oxide ($MgO_2$)), or nitrides (e.g., aluminum nitride (AlN) or SiN).

When passivation layers 132B are formed with carbon-containing passivation gases (e.g., fluoroform ($CHF_3$), octafluorocyclobutane ($C_4F_8$), or carbon tetrafluoride ($CF_4$)) and etching gases, such as $SF_6$, $WF_6$, $Cl_2$, $NF_3$, $ClF_3$, boron trichloride ($BCl_3$), hexafluoroethane ($C_2F_6$), carbon chloride ($CCl_2$), carbon tetrachloride ($CCl_4$), dichlorodifluoromethane ($CF_2Cl_2$), bromotrifluoromethane ($CF_3Br$), silicon tetrachloride ($SiCl_4$), hydrogen bromide (HBr), hydrogen iodide (HI), or xenon difluoride ($XeF_2$)), passivation layers 132B can include a carbon-rich material composition. The carbon-rich material composition can include (i) a carbon concentration in a range from about 1 atomic percent to about 70 atomic percent (e.g., about 1 atomic percent, about 5 atomic percent, about 15 atomic percent, about 25 atomic percent, about 45 atomic percent, about 50 atomic percent, or about 70 atomic percent), (ii) a fluorine concentration in a range from about 1 atomic percent to about 20 atomic percent (e.g., about 1 atomic percent, about 5 atomic percent, about 10 atomic percent, about 15 atomic percent, or about 20 atomic percent), (iii) an oxygen concentration in a range from about 1 atomic percent to about 50 atomic percent (e.g., about 1 atomic percent, about 5 atomic percent, about 10 atomic percent, about 25 atomic percent, or about 50 atomic percent), and/or (iv) a nitrogen concentration in a range from about 2 atomic percent to about 20 atomic percent (e.g., about 2 atomic percent, about 5 atomic percent, about 10 atomic percent, about 15 atomic percent, or about 20 atomic percent), and traces of hydrogen.

When passivation layers 132B are formed with nitrogen-containing passivation gases (e.g., ammonia ($NH_3$), nitrous oxide ($N_2O$), or nitrogen ($N_2$)), passivation layers 132B can include a nitrogen-rich material composition including nitrogen concentration in a range from about 20 atomic percent to about 80 atomic percent (e.g., about 20 atomic percent, about 40 atomic percent, about 60 atomic percent, or about 80 atomic percent). In some embodiments, carbon-rich passivation layers 132B can provide a lower deposition selectivity of the S/D contact plug materials to ILD sidewalls 130As-130Bs compared to oxygen-rich passivation layers 132B or nitrogen-rich passivation layers 132B. In some embodiments, passivation layers 132B can act as diffusion barrier layers to prevent diffusion of S/D contact plug materials into ILD layers 130A and/or 130B.

Passivation layers 132B can have horizontal dimensions (e.g., thickness) along an X-axis in a range from about 0.02 nm to about 10 nm (e.g., about 0.02 nm, about 0.05 nm, about 0.1 nm, about 0.5 nm, about 1 nm, about 2 nm, about 3.5 nm, about 7.5 nm, or about 10 nm). The horizontal dimensions of passivation layers 132B along ILD sidewalls 130As can be equal to or greater than the horizontal dimensions of passivation layers 132B along ILD sidewalls 130Bs.

In some embodiments, instead of passivation layers 132B, a layer of metal oxide can be disposed along ILD sidewalls 130As-130Bs to inhibit the deposition of S/D contact plug materials on ILD sidewalls 130As-130Bs. The layer of metal oxide can include oxides of W, Mo, Ir, Pt, Os, Ti, Ni, Ta, TiN, or TaN and can have a horizontal dimension (e.g., thickness) along an X-axis in a range from about 0.5 nm to about 5 nm (e.g., about 0.5 nm, about 1 nm, about 3 nm, or about 5 nm).

S/D contact plugs 132C can be disposed within ILD layers 130A-130B and can include a conductive material, such as Ru, Ir, Ni, Os, Rh, Al, Mo, W, Co Al, or Cu. In some embodiments, S/D contact plugs 132C can include a conductive material with low resistivity (e.g., about $50\mu\Omega$-cm, about $40\mu\Omega$-cm, about $30\mu\Omega$-cm, about $20\mu\Omega$-cm, or about $10\mu\Omega$-cm). The portions of S/D contact plugs 132C in ILD layers 130A and 130B can have material composition and/or resistivity similar to or different from each other.

In some embodiments, S/D contact plugs 132C can include horizontal dimensions (e.g., width or diameter) along an X-axis in a range from about 10 nm to about 20 nm or less than about 20 nm (e.g., about 15 nm, about 12.5 nm, about 10 nm, about 7.5 nm, about 5 nm, or about 2 nm). The horizontal dimensions of the portions of S/D contact plugs 132C in ILD layer 130B can be greater than that of the portions of S/D contact plugs 132C in ILD layer 130A. In some embodiments, portions $132C_1$ can have a greater sidewall slope than the sidewall slope of the remaining portions of S/D contact plugs 132C to provide larger electrical contact areas for overlying structures, such as via structures and/or conductive lines. The larger electrical contact areas can reduce contact resistance between S/D contact plugs 132C and the overlying structures, thus improving the electrical conductance of S/D contact structures 132.

S/D contact plugs 132C can have a high aspect ratio (e.g., about 10, about 15, about 20, or about 30), where the aspect ratio can be a ratio of their vertical dimensions (e.g., height) along a Z-axis to their horizontal dimensions (e.g., width or diameter) along an X-axis. The vertical dimensions of S/D contact plugs 132C can range from about 100 nm to about 150 nm (e.g., about 100 nm, about 120 nm, about 135 nm, or about 150 nm). In some embodiments, Ru-based S/D contact plugs 132C with the horizontal dimensions less than about 20 nm can have lower resistivity compared to Cu, W, or Co-based S/D contact plugs 132C with similar horizontal dimensions.

Figure 1B:
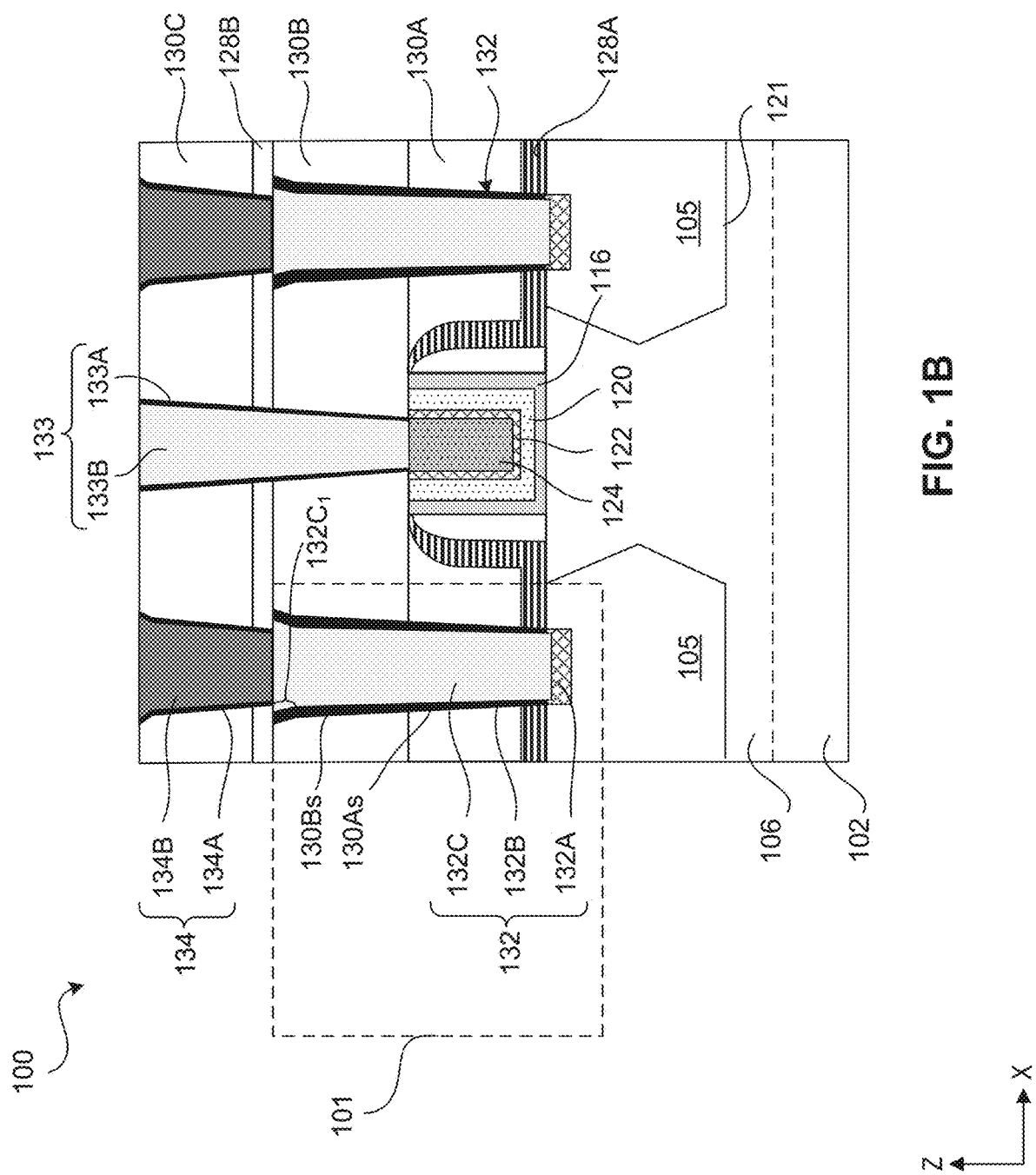

S/D contact structures 132 can have other structural configurations besides that shown in FIG. 1B. For example, FIGS. 2A-2F illustrate enlarged views of finFET region 101 of FIG. 1B with different structural configurations of S/D contact structures 132. The different structural configurations shown in FIGS. 2A-2F can be based on the different passivation and/or etching process parameters used during the surface passivation of ILD sidewalls 130A-130B and/or top surfaces of silicide layers 132A prior to the formation of S/D contact plugs 132C.

For example, compared to S/D contact plugs 132 of FIG. 1B, S/D contact plug of FIG. 2A has portion $132C_2$ extending into silicide layer 132A along an X-axis under ESL 128A and along a Z-axis. This extended portion $132C_2$ can be formed in a cavity of silicide layer 132A produced due to higher etching gas to passivation gas ratio (e.g., about 5:1) and longer etching time used during the surface passivation of top surface of silicide layer 132A of FIG. 2A compared to the etching gas to passivation gas ratio (e.g., about 1:1) and etching time used for silicide layers 132A of FIG. 1B. The higher etching gas to passivation gas ratio can cause isotropic etching of silicide layer 132A of FIG. 2A compared to anisotropic etching of silicide layers 132A of FIG. 1B. For similar etching gas to passivation gas ratio (e.g., 1:1), but longer etching time used for silicide layer 132A of FIG. 2B compared to that used for silicide layers 132A of FIG. 1B, portion $132C_2$ of FIG. 2B can extend along a Z-axis without extending along an X-axis under ESL 128A. Portion $132C_2$ of FIG. 2B can extend deeper into silicide layer 132A than portion $132C_2$ of FIG. 2A due to longer etching time.

In some embodiments, the different sidewall profiles of S/D contact plugs 132 as shown in FIG. 1B and FIGS. 2A-2B can be due to the profiles of ILD sidewalls 130As-130Bs and passivation layers 132B produced as a result of the surface passivation of ILD sidewalls 130A-130B and/or the top surfaces of silicide layers 132A prior to the formation of S/D contact plugs 132C. The different profiles of ILD sidewalls 130As-130Bs can be due to different processing parameters (e.g., power) of plasma gases used during the surface passivation.

Referring back to FIG. 1B, gate contact structure 133 can be configured to electrically connect gate structure 108 to other elements of finFET 100 and/or of the integrated circuit. Gate contact structure 133 can be disposed within ESL 128B and ILD layers 130C-130C and on gate structure 108. Gate contact structure 133 can include (i) a passivation layer 133A and (ii) a gate contact plug 133B. The above discussion of passivation layers 132B and S/D contact plugs 132C applies to passivation layers 133A and gate contact plug 133B, respectively, unless mentioned otherwise.

Via structures 134 can be disposed within ESL 128B and ILD layer 130C and on S/D contact plugs 132C. In some embodiments, via structures 134 can include horizontal dimensions (e.g., width or diameter) along an X-axis in a range from about 5 nm to about 10 nm (e.g., about 5 nm, about 7 nm, or about 10 nm). Each of via structures 134 can include (i) a passivation layer 134A and (ii) a via plug 134B. The above discussion of passivation layers 132B and S/D contact plugs 132C applies to passivation layers 134A and via plugs 134B, respectively, unless mentioned otherwise. Also, the above discussion of the formation of S/D contact plugs 132C on and/or within silicide layers 132A with reference to FIGS. 1B and 2A-2F can apply to the formation of via plugs 134B on and/or within S/D contact plugs 132C, respectively. In some embodiments, via plugs 134B can include low-resistivity metals, such as Ru, Co, Ni, Al, Mo, W, Ir, Os, Cu, or Pt. In some embodiments, Ru-based via plugs 134B with dimensions less than about 20 nm (e.g., about 15 nm, about 12.5 nm, about 10 nm, about 7.5 nm, about 5 nm, or about 2 nm) can have lower resistivity compared to Cu, W, or Co-based via plugs 134B with similar dimensions. Though FIG. 1B shows via structures, the discussion of material composition of passivation layers 134A and via plugs 134B can apply to conductive lines (not shown) on S/D contact structures 132.

Figure 3:
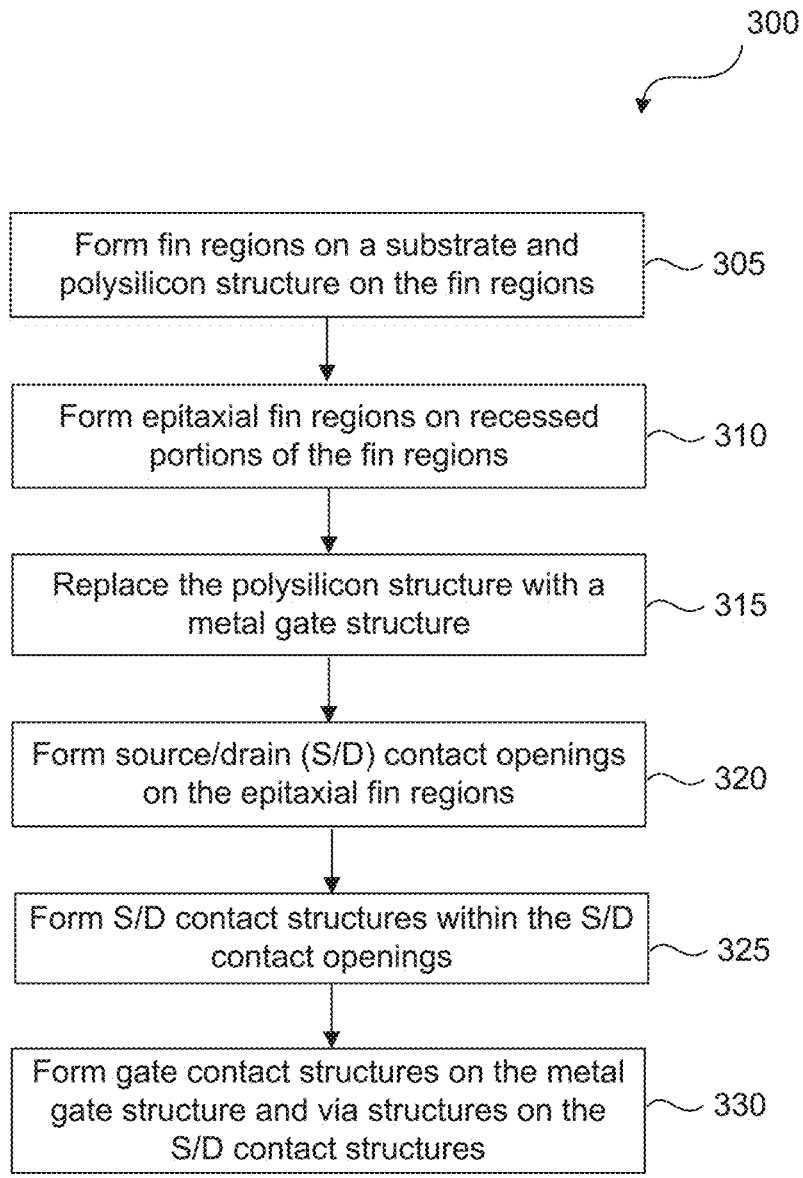
FIG. 3 is a flow diagram of a method for fabricating a finFET with contact and via structures, in accordance with some embodiments.
Figure 11:
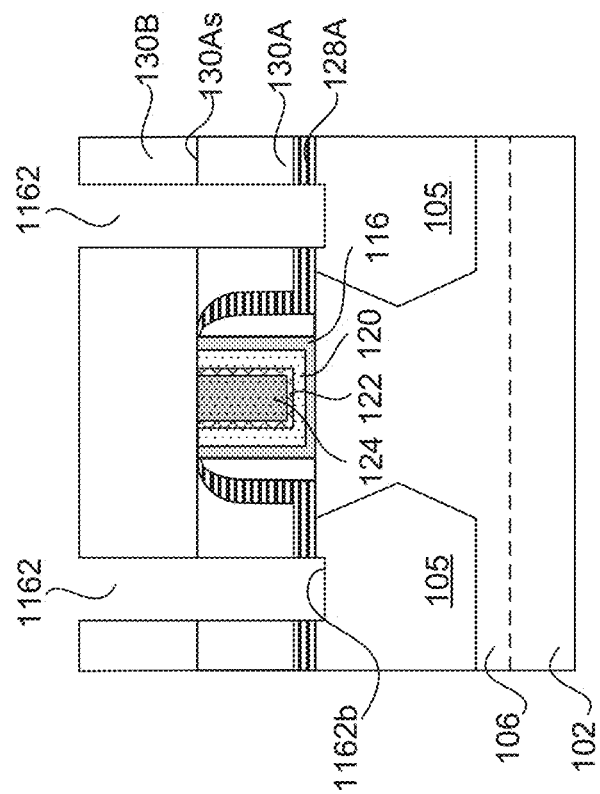
FIGS. 10-11 illustrate cross-sectional views of a finFET at various stages of its fabrication process, in accordance with some embodiments.
Figure 10:
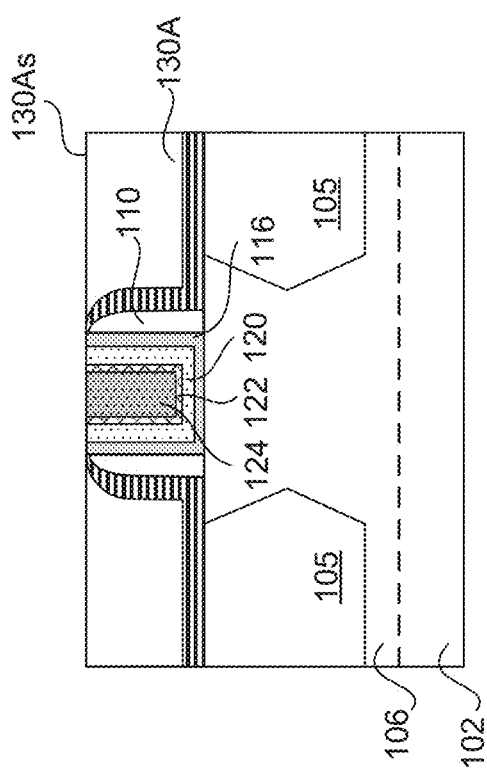
Figure 16:
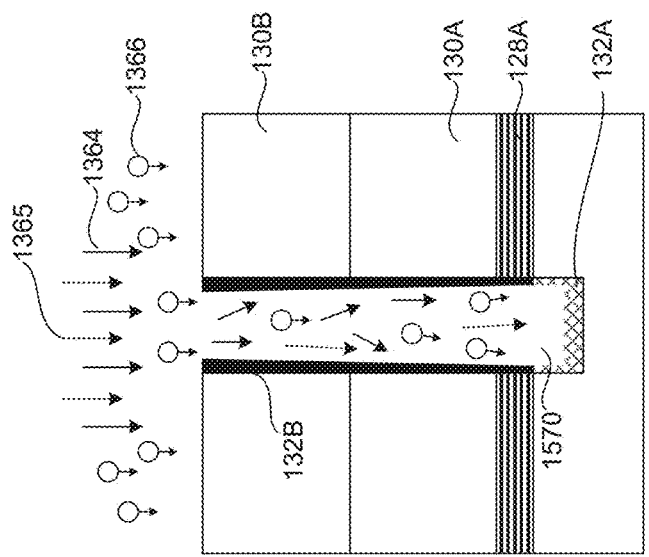
Figure 17:
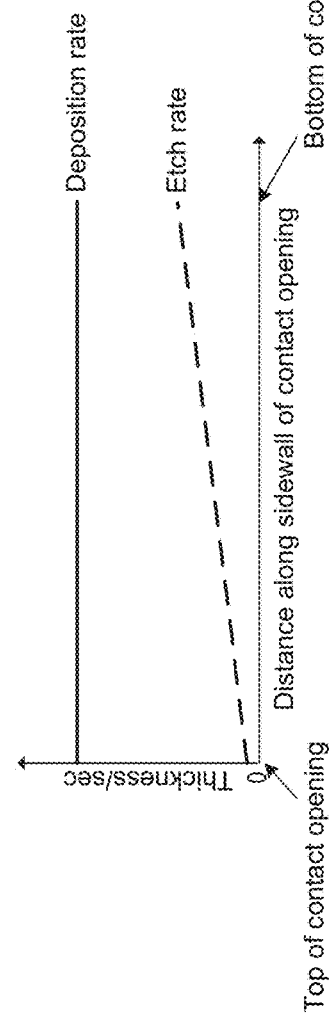
FIG. 17 illustrates deposition and etching rates of a passivation layer in a source/drain contact structure at a stage of its fabrication process, in accordance with some embodiments.
Figure 18:
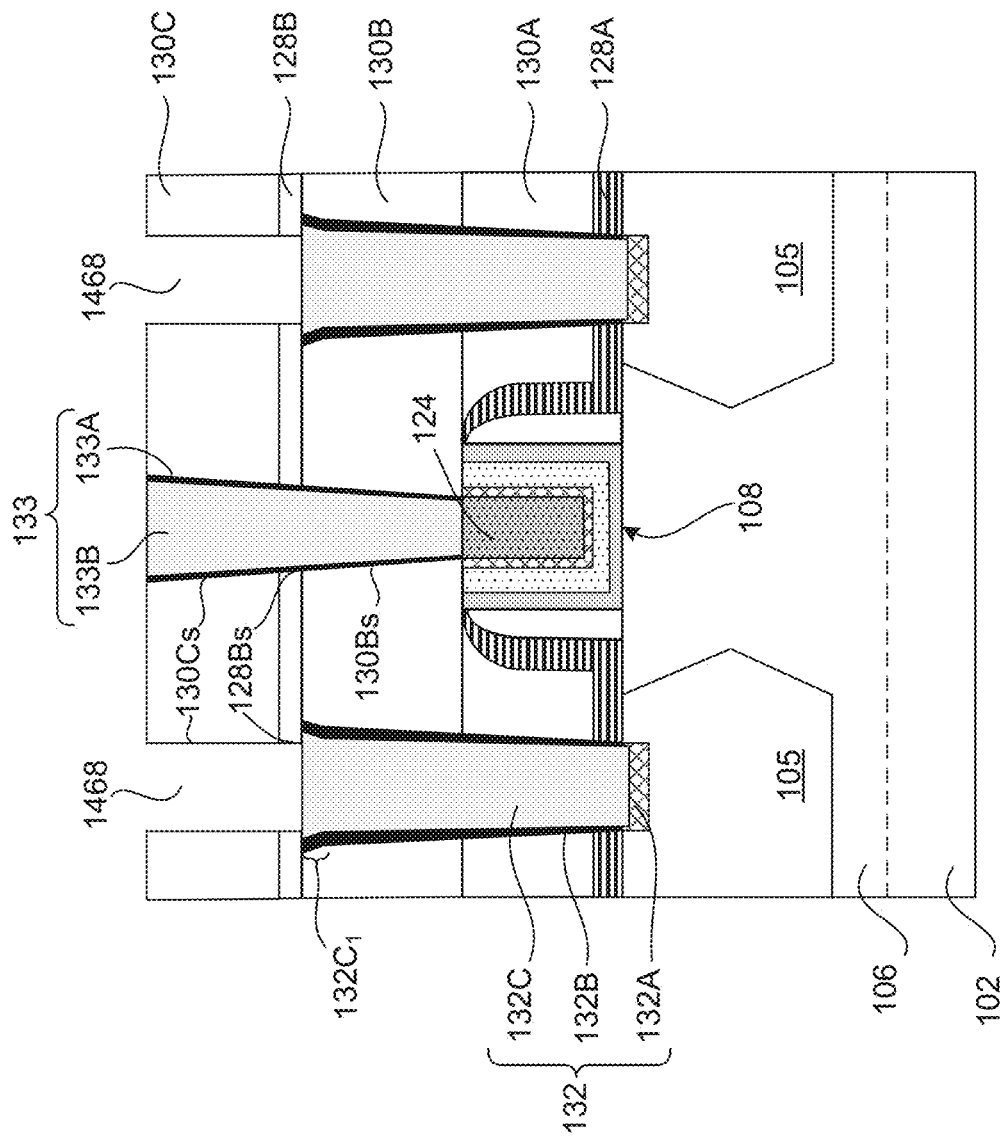
FIG. 18 illustrate a cross-sectional view of a finFET at a stage of its fabrication process, in accordance with some embodiments.

FIG. 3 is a flow diagram of an example method 300 for fabricating finFET 100, according to some embodiments. For illustrative purposes, the operations illustrated in FIG. 200 will be described with reference to the example fabrication process for fabricating finFET 100 as illustrated in FIGS. 4-18 and 19A-19F. FIGS. 4-9 are isometric views of finFET 100 at various stages of its fabrication process. FIGS. 10-11 and 18 are cross-sectional views along line A-A of finFET 100 of FIG. 1A at various stages of its fabrication process, according to some embodiments. FIGS. 12-16 and 19A-19F are enlarged views of finFET region 101 of FIG. 1B at various stages of its fabrication process, according to some embodiments. FIG. 17 shows deposition and etching rates of passivation layers 132A in source/drain contact structures 132 at a stage of its fabrication process, in accordance with some embodiments. Operations can be performed in a different order or not performed depending on specific applications. It should be noted that method 300 may not produce a complete finFET 100. Accordingly, it is understood that additional processes can be provided before, during, and after method 300, and that some other processes may only be briefly described herein. Elements in FIGS. 4-18 and 19A-19F with the same annotations as elements in FIGS. 1A-1B and 2A-2F are described above.

In operation 305, fin regions are formed on a substrate, a polysilicon structure is formed on the fin regions, and spacers are formed on the polysilicon gate structure. For example, as described with reference to FIGS. 4-8, fin regions 504 (shown in FIG. 6) can be formed on substrate 102, a polysilicon structure 760 (shown in FIG. 7) can be formed on fin regions 504, and spacers 110 (shown in FIG. 8) can be formed on polysilicon structure 760.

Figure 4:
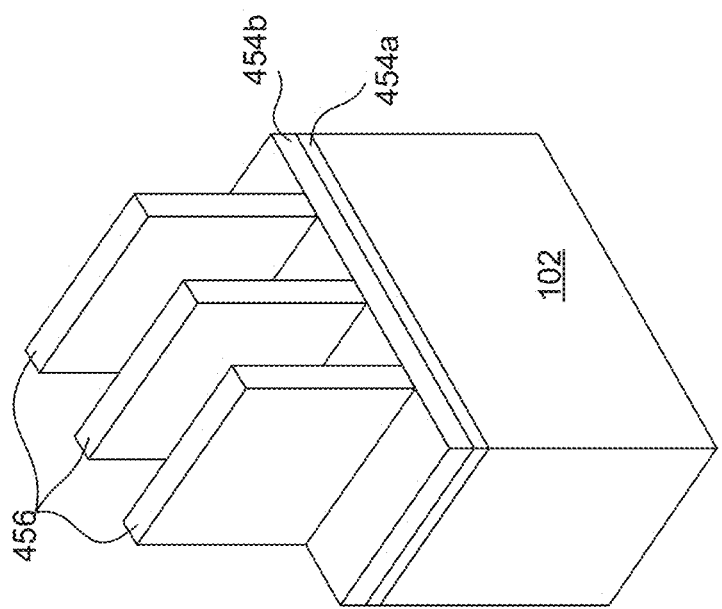

Referring to FIG. 4, the formation of fin regions 504 can include forming a pad layer 454a and a hard mask layer 454b on substrate 102 and a patterned photoresist layer 456 on hard mask layer 454b. Pad layer 454a can be a thin film including silicon oxide formed, for example, using a thermal oxidation process. Pad layer 454a can also act as an etch stop layer for etching hard mask layer 454b. In an embodiment, hard mask layer 454b can be formed of silicon nitride using, for example, low pressure chemical vapor deposition (LPCVD) or plasma enhanced CVD (PECVD). Hard mask layer 454b can be used as a hard mask during subsequent photolithography processes.

Figure 5:
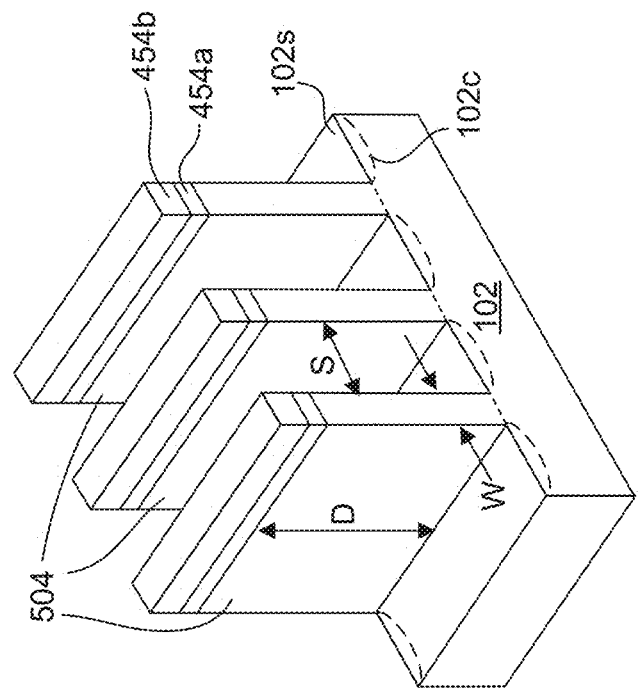
FIGS. 4-9 illustrate isometric views of a finFET at various stages of its fabrication process, in accordance with some embodiments.

Referring to FIG. 5, the formation of fin regions 504 can further include etching portions of hard mask layer 454b and pad layer 454a not covered by patterned photoresist layer 456 to expose underlying substrate 102. The exposed substrate 102 can then be etched to form fin regions 504, followed by removal of patterned photoresist layer 456. In some embodiments, fin regions 504 each can have fin widths W less than about 30 nm and depth D in a range from about 210 nm to about 250 nm, while spacing S between fin regions 504 can be less than about 50 nm. In some embodiments, top surface of substrate 102 can be a planar surface 102s or a curved surface 102c depending on the etching process used to form fin regions 504.

Figure 6:
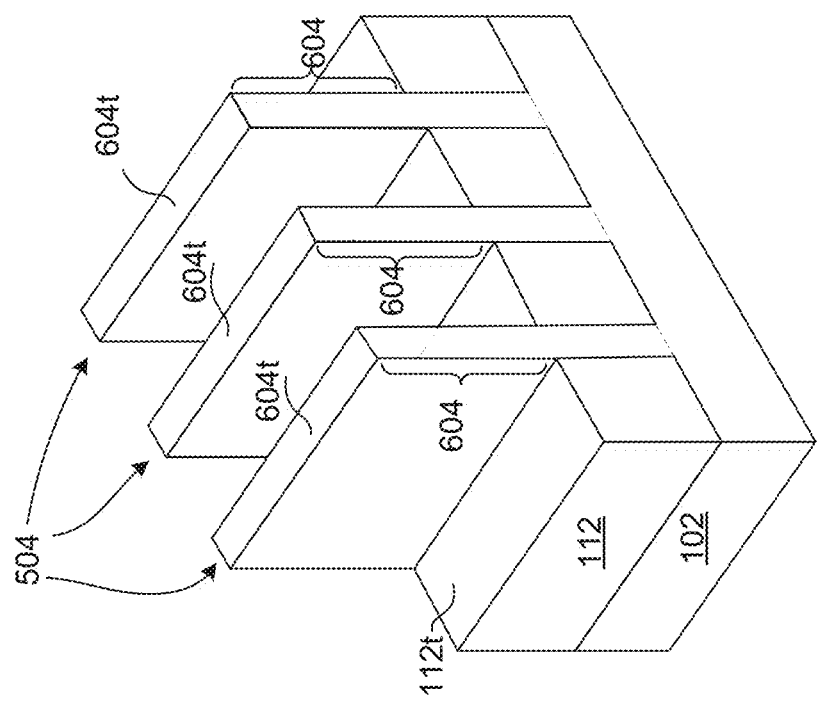
Figure 9:
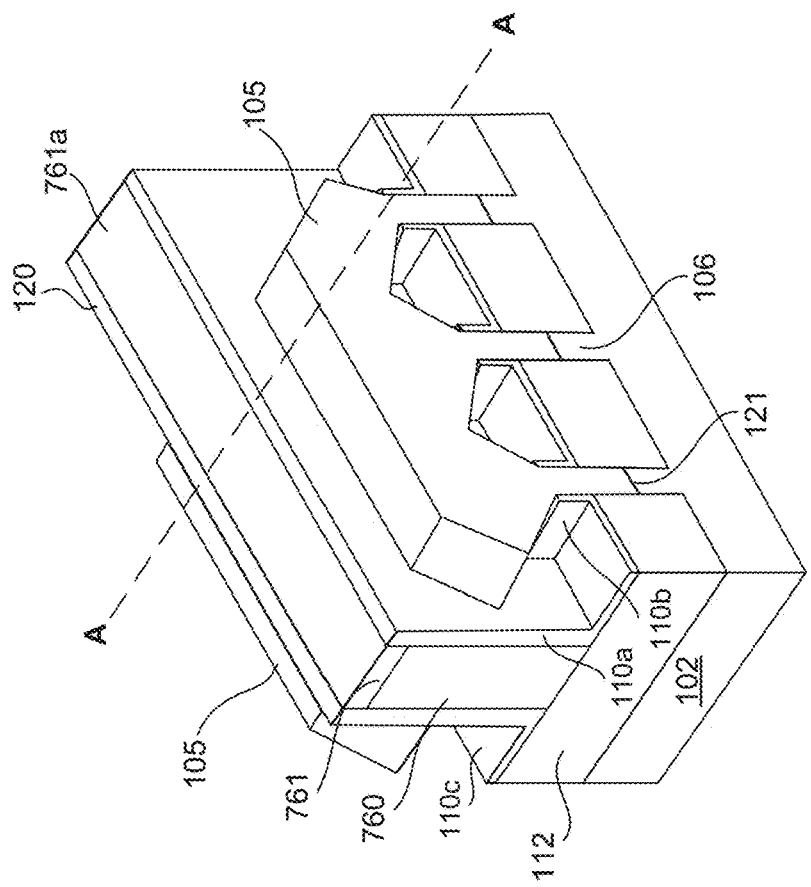

The process for forming fin regions 504 can be followed by forming STI regions 112. Referring to FIG. 6, the process for forming STI regions 112 can include blanket depositing a dielectric material on fin regions 504 and substrate 102. The blanket deposition can be followed by an etching of the deposited dielectric material to form STI regions 112. In some embodiments, the dielectric material can include, for example, silicon oxide, silicon nitride, silicon oxynitride, fluoride-doped silicate glass (FSG), or a low-k dielectric material. In some embodiments, the dielectric material can be formed using a flowable chemical vapor deposition (FCVD) process, a high-density-plasma (HDP) CVD process, using silane ($SiH_4$) and oxygen ($O_2$) as reacting precursors. In some embodiments, the dielectric material can be formed using a sub-atmospheric CVD (SACVD) process or high aspect-ratio process (HARP), where process gases can include tetraethoxysilane (TEOS) and/or ozone ($O_3$). In some embodiments, the dielectric material can be formed using a spin-on-dielectric (SOD), such as hydrogen silsesquioxane (HSQ) or methyl silsesquioxane (MSQ).

The etching of the dielectric material can be performed using a wet etching process by, for example, dipping substrate 102 in hydrofluoric acid (HF). Alternatively, the etching operation can be performed using a dry etching process using, for example, $CHF_3$ or $BF_3$ as etching gases. Upper fin portions 604 of fin regions 504, protruding over flat top surfaces 112t of STI regions 112 can be used to form channel regions of finFET 100. Upper fin portions 604 can include top surfaces 604t. In some embodiments, flat top surfaces 112t of STI regions 112 can be lower than top surfaces 604t. In some embodiments, a vertical dimension of each of the upper fin portions 604 can be in a range from about 15 nm to about 50 nm, from about 20 nm to about 40 nm, or from about 25 nm to about 35 nm.

Figure 7:
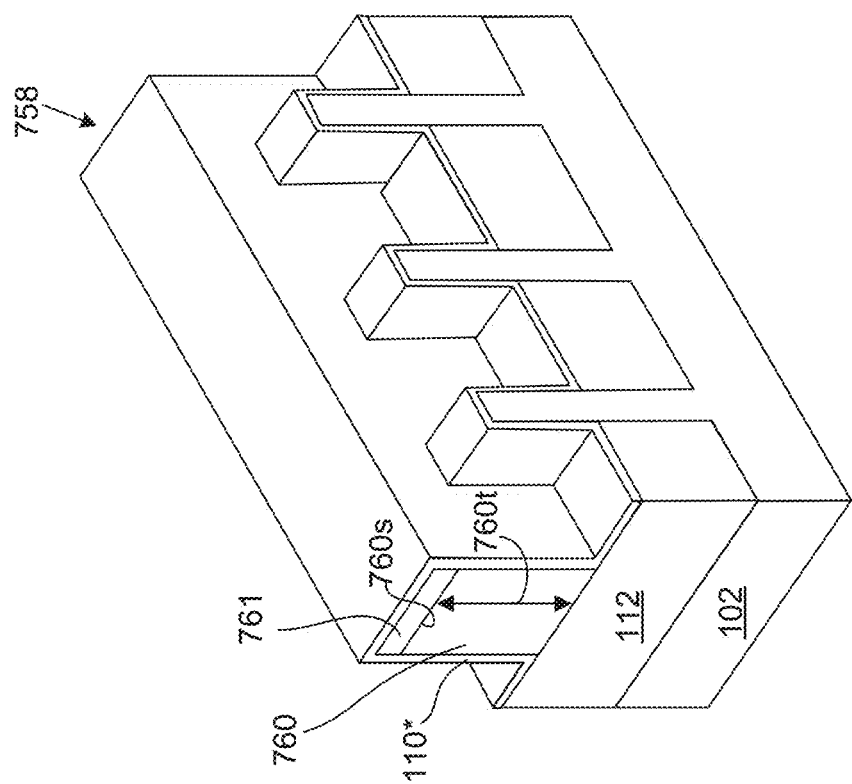

The process for forming STI regions 112 can be followed by forming polysilicon structure 760. In some embodiments, an oxide layer (not shown) can be deposited on the structure of FIG. 6, prior to forming polysilicon structure 760. Referring to FIG. 7, the process for forming polysilicon structure 760 can include blanket depositing a layer of polysilicon on the structure of FIG. 6 and patterning and etching the layer of polysilicon to form polysilicon structure 760 of FIG. 7. The blanket deposition processes can include chemical vapor deposition (CVD), physical vapor deposition (PVD), atomic layer deposition (ALD), other suitable deposition methods, or a combination thereof. The patterning can include photolithography and the etching can include dry etching, wet etching, and/or other etching methods (e.g., reactive ion etching). Polysilicon structure 760 can be formed over top surfaces 112t of STI regions 112 and wrapped around surfaces of fin regions 604 protruding over STI regions 112. In some embodiments, a vertical dimension 760t of patterned polysilicon structure 760 can be in a range from about 90 nm to about 200 nm. In some embodiments, patterned polysilicon structure 760 can be replaced in a gate replacement process during subsequent processing of finFET 100 to form gate structure 108.

Figure 8:
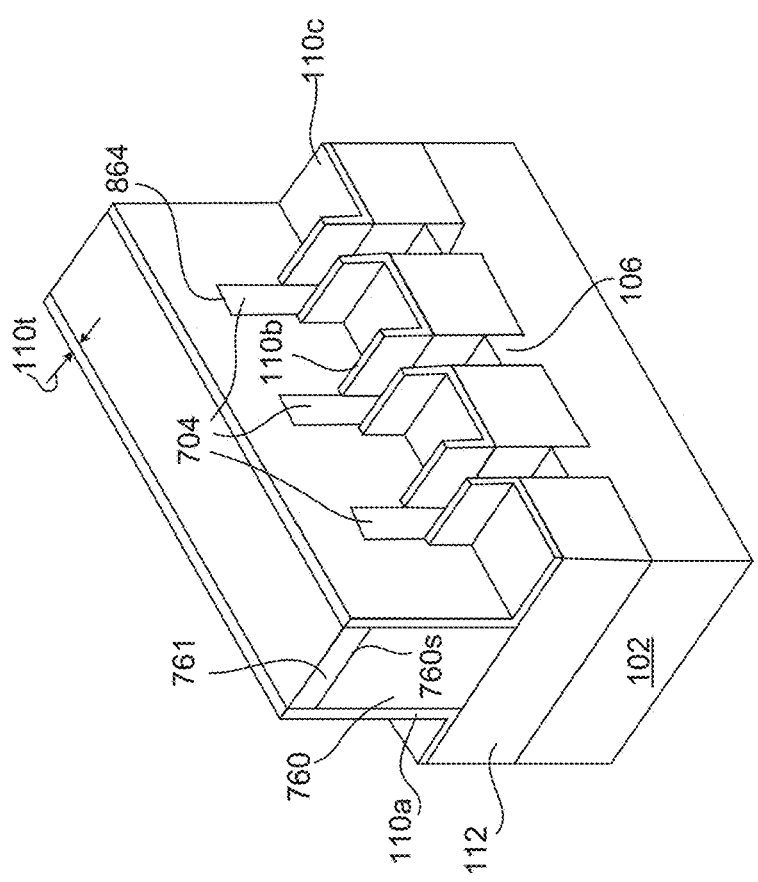

The process for forming polysilicon structure 760 can be followed by forming spacers 110. The process for forming spacers 110 can include forming hard mask layer 761 (e.g., silicon nitride) over top surface 760s of polysilicon structure 760 and blanket depositing spacer material layer 110* by CVD, PVD, ALD, or other suitable technique to cover exposed surfaces of polysilicon structure 760 and hard mask layer 761. Spacer material layer 110* can also cover top surfaces 112t and surfaces of fin regions 604 protruding over STI regions 112 not covered by polysilicon structure 760. Spacer material layer 110* can include (i) a dielectric material, such as silicon oxide, silicon carbide, silicon nitride, or silicon oxy-nitride, (ii) an oxide material, (iii) a nitride material, (iv) a low-k material, or (v) a combination thereof. Non-patterned spacer 110* may include dielectric material, such as silicon oxide, silicon carbide, silicon nitride, silicon oxy-nitride, or other suitable materials. Spacer material layer 110* can be dry etched using, for example, reactive ion etching (ME) or other dry etching process using a chlorine or fluorine based etchant to form spacers 110 having spacer portions 110a, 110b, and 110c as shown in FIG. 8. Spacer 110 can have a thickness 110t in a range from 5 nm to 15 nm, according to some embodiments.

Referring to FIG. 3, in operation 310, epitaxial fin regions are formed on recessed fin regions. For example, as described with reference to FIGS. 8-9, epitaxial fin regions 105 can be formed on recessed fin regions 106. The formation of recessed fin regions 106 can include etching portions of fin regions 604 not covered by polysilicon structure 760 and spacer portions 110a. The non-recessed portions of fin regions 604 can underlie spacer portions 110a and polysilicon structure 760 and form interfaces 864 with spacer portions 110a and polysilicon structure 760. In some embodiments, a biased etching process can be performed to form recessed fin regions 106. The etching process can be performed under a pressure of about 1 mTorr to about 1000 mTorr, a power of about 50 W to about 1000 W, a bias voltage of about 20 V to about 500 V, at a temperature of about 40° C. to about 60° C., and using HBr and/or $Cl_2$ as etch gases. During the etching process, top surface 760s of polysilicon structure 760 can be protected from being etched by hard mask 761.

The process for forming recessed fin regions can be followed by forming epitaxial fin regions 105. A semiconductor material of epitaxial fin regions 105 can be selectively epitaxially-grown over recessed fin regions 106. In some embodiments, the selective epitaxial growth of the semiconductor material can continue until the semiconductor material extends vertically a distance in a range from about 10 nm to about 100 nm above top surface 102s of substrate 102 and extends laterally over top surfaces of some of STI regions 112. The semiconductor material can include: (i) a semiconductor material, such as germanium or silicon; (ii) a compound semiconductor material, such as gallium arsenide and/or aluminum gallium arsenide; or (iii) a semiconductor alloy, such as silicon germanium and/or gallium arsenide phosphide.

The epitaxial processes for growing the semiconductor material can include CVD deposition techniques (e.g., LPCVD, vapor-phase epitaxy (VPE), and/or ultra-high vacuum CVD (UHV-CVD)), molecular beam epitaxy, and/or other suitable processes. In some embodiments, the semiconductor material, such as silicon carbide (SiC), can be epitaxially grown by a LPCVD process to form n-type epitaxial fin regions 105. The LPCVD process for n-type epitaxial fin regions 105 can be performed at a temperature of about 400 to about 800° C., under a pressure of about 1 Torr to about 200 Torr, and using $Si_3H_8$ and $SiH_3CH$ as reaction gases. In some embodiments, the semiconductor material, such as silicon germanium (SiGe), can be epitaxially grown by a LPCVD process to form p-type epitaxial fin regions 105. The LPCVD process p-type epitaxial fin regions 105 can be performed at a temperature of about 400° C. to about 800° C., under a pressure of about 1 Torr to about 200 Torr, and using $SiH_4$ and $GeH_4$ as reaction gases.

In some embodiments, p-type epitaxial fin regions 105 can include SiGe and can be in-situ doped during an epitaxial growth process using p-type dopants, such as boron, indium, or gallium. For p-type in-situ doping, p-type doping precursors, such as diborane ($B_2H_6$), boron trifluoride ($BF_3$), and/or other p-type doping precursors can be used. In some embodiments, n-type epitaxial fin regions 105 can include Si and can be in-situ doped during an epitaxial growth process using n-type dopants, such as phosphorus or arsenic. For n-type in-situ doping, n-type doping precursors, such as phosphine ($PH_3$), arsine ($AsH_3$), and/or other n-type doping precursor can be used. In some embodiments, epitaxial fin regions 105 are not in-situ doped, and an ion implantation process is performed to dope epitaxial fin regions 105. One or more annealing processes can be performed to activate epitaxial fin regions 105. Annealing processes can include rapid thermal annealing (RTA) and/or laser annealing processes.

Referring to FIG. 3, in operation 315, the polysilicon structure is replaced with a metal gate structure. For example, as described with reference to FIG. 10, polysilicon structure 760 can be replaced with gate structure 108 after forming epitaxial fin regions 105 in operation 310, which can be followed by forming ESL layer 128A and ILD layer 130A. The process for forming ESL 128A can include blanket depositing a layer of material for ESL 28A on the structure of FIG. 9 using PECVD, sub atmospheric chemical vapor deposition (SACVD), LPCVD, ALD, high-density plasma (HDP), plasma enhanced atomic layer deposition (PEALD), molecular layer deposition (MLD), plasma impulse chemical vapor deposition (PICVD), or other suitable deposition methods.

The blanket deposition of the layer of material for ESL 128A can be followed by a blanket depositing a layer of dielectric material for ILD 130A. The blanket deposition process can be followed by a thermal annealing of the deposited layer of dielectric material in steam at a temperature ranging from about 200° C. to about 700° C. for a period ranging from about 30 minutes to about 120 minutes. The thermal annealing can be followed by a CMP process to coplanarize top surfaces of ESL 128A, ILD 130A, and spacers 110 with each other as shown in FIG. 10. During the CMP process, hard mask layer 761 can be removed.

The process for forming ILD layer 130A can be followed by forming gate structure 108, which can include the selective removal of polysilicon structure 760. Polysilicon structure 760 can be removed using a dry etching process (e.g., reaction ion etching) or a wet etching process. In some embodiments, the gas etchants used in the dry etching process can include chlorine, fluorine, bromine, or a combination thereof. In some embodiments, an ammonium hydroxide ($NH_4OH$), sodium hydroxide (NaOH), and/or potassium hydroxide (KOH) wet etch can be used to remove polysilicon structure 760 or a dry etch followed by a wet etch process can be used to remove polysilicon structure 760.

The process for forming gate structure 108 can further include depositing (i) a layer of dielectric material for gate dielectric layer 116, (ii) a layer of conductive barrier material for gate barrier layer 120 on the layer of dielectric material, (iii) a layer of work function metal for gate work function layer 122 on the layer of conductive barrier material, and (iv) a layer of conductive material for gate metal fill layer 124 on the layer of work function metal. In some embodiments, the layers of dielectric material, conductive barrier material, and work function metal can each form conformal layers within a cavity (not shown) formed as result of the removal of polysilicon structure 760.

The layer of dielectric material for gate dielectric layer 116 can include silicon oxide and can be formed by CVD, atomic layer deposition (ALD), physical vapor deposition (PVD), e-beam evaporation, or other suitable processes. In some embodiments, the layer of dielectric material can include (i) a layer of silicon oxide, silicon nitride, and/or silicon oxynitride, (ii) a high-k dielectric material, such as hafnium oxide ($HfO_2$), $TiO_2$, HfZrO, $Ta_2O_3$, $HfSiO_4$, $ZrO_2$, and $ZrSiO_2$, (iii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or (iv) a combination thereof. High-k dielectric layers can be formed by ALD and/or other suitable methods.

The layer of conductive barrier material for gate barrier layer 120 can include Ti, Ta, TiN, TaN, or other suitable diffusion barrier materials and can be formed by ALD, PVD, CVD, or other suitable metal deposition processes. In some embodiments, the layer of conductive barrier material can include substantially fluorine-free metal or metal-containing film and can be formed by ALD or CVD using one or more non-fluorine based precursors. The substantially fluorine-free metal or fluorine-free metal-containing film can include an amount of fluorine contaminants less than 5 atomic percent in the form of ions, atoms, and/or molecules.

The layer of work function metal for work function layer 122 can include Al, Cu, W, Ti, Ta, TiN, TaN, NiSi, CoSi, Ag, TaC, TaSiN, TaCN, TiAl, TiAlN, WN, metal alloys, and/or combinations thereof. In some embodiments, the layer of work function metal can include Al-doped metal, such as Al-doped Ti, Al-doped TiN, Al-doped Ta, or Al-doped TaN. The layer of work function metal can be deposited using a suitable process such as ALD, CVD, PVD, plating, or combinations thereof. The layer of conductive material for gate metal fill layer 124 can include Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof and can be formed by ALD, PVD, CVD, or other suitable deposition processes. The deposited layers of dielectric material, conductive barrier material, work function metal, and conductive material can be planarized by a CMP process to form the structure of FIG. 10. The CMP process can substantially coplanarize top surfaces of gate dielectric layer 116, gate barrier layer 120, gate work function layer 122, and gate metal fill layer 124 with top surface of ILD layer 130A as shown in FIG. 10.

Referring to FIG. 3, in operation 320, S/D contact openings are formed on the epitaxial regions. For example, as described with reference to FIG. 11, S/D contact openings 1162 can be formed on epitaxial regions 105 through ILD layers 130A-130B and ESL 128A. The process for forming S/D contact openings 1162 can include (i) removing portions of ILD layers 130a-130B overlying epitaxial fin regions 105 and (ii) removing portions of ESL 128A underlying the etched portions of ILD layers 130A-130B. The process for removing portions of ILD layers 130A-130B can include patterning using photolithography to expose areas on top surface of ILD layer 130B corresponding to the portions of ILD layers 130A-130B to be removed. The portions of ILD layers 130A-130B can be removed by a dry etching process. In some embodiments, the dry etching process can be a fluorine-based plasma etching process.

The ILD etch process can include two etch operations. In the first etch operation, the etching can be performed using $CF_4$ gas at a flow rate ranging from about 50 sccm to about 500 sccm. In the second etch operation, the etching can be performed using a gas mixture including $C4F_6$ gas at a flow rate ranging from about 5 sccm to about 50 sccm, Ar gas at a flow rate ranging from about 100 sccm to about 500 sccm, and $O_2$ gas at a flow rate ranging from about 5 sccm to about 50 sccm. In some embodiments, each of the first and second etch operations can be performed for a time period ranging from about 1 sec to about 60 sec. In some embodiments, each of the first and second etch operations can be performed at a temperature ranging from about 10° C. to about 100° C., under a pressure ranging from about 3 mTorr to about 500 mTorr, and at an RF power ranging from about 300 W to about 800 W. In some embodiments, the first etch operation can have a higher etch rate than the second etch operation.

The process for etching the portions of ILD layers 130A-130B can be followed by dry etching portions of ESL 128A underlying the etched portions of ILD layers 130A-130B. In some embodiments, these portions of ESL 128A can be etched in two operations. In the first etch operation, the etching can be performed using a gas mixture including difluoromethane ($CH_2F_2$) gas at a flow rate ranging from about 5 sccm to about 50 sccm and carbon tetrafluoride ($CF_4$) gas at a flow rate ranging from about 10 sccm to about 100 sccm. In the second etch operation, the etching can be performed using a gas mixture including fluoromethane ($CH_3F$) gas at a flow rate ranging from about 5 sccm to about 50 sccm, Ar gas at a flow rate ranging from about 100 sccm to about 500 sccm, and $H_2$ gas at a flow rate ranging from about 100 sccm to about 500 sccm. In some embodiments, each of the first and second etch operations can be performed for a time period ranging from about 1 sec to about 60 sec. In some embodiments, each of the first and second etch operations can be performed at a temperature ranging from about 10° C. to about 100° C., under a pressure ranging from about 10 mTorr to about 100 mTorr, and at an RF power ranging from about 500 W to about 800 W. In some embodiments, the first etch operation can have a higher etch rate than the second etch operation.

In some embodiments, S/D contact openings 1162 can have horizontal dimensions along an X-axis ranging from about 10 nm to about 20 nm (e.g., about 10 nm, about 15 nm, or about 20 nm) and vertical dimensions along a Z-axis ranging from about 100 nm to about 150 nm (e.g., about 100 nm, about 120 nm, about 140 nm, or about 150 nm). Sidewalls 130As-130Bs of respective ILD layers 130A-130B can form sidewalls of S/D contact openings 1162.

Figure 12:
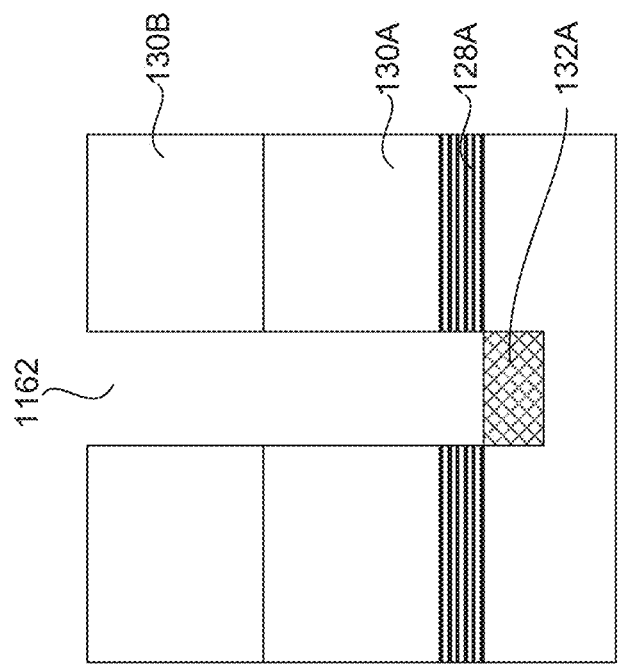

Referring to FIG. 3, in operation 325, S/D contact structures are formed within the S/D contact openings. For example, as described with reference to FIGS. 12-18, S/D contact structures 132 (shown in FIG. 1B) can be formed within S/D contact openings 1162 formed in operation 320. The process for forming S/D contact structures 132 can include sequential operations of: (i) forming silicide layers 132A as shown in FIG. 12, (ii) selectively forming passivation layers 132B as shown in FIG. 16, (iii) forming trenches 1570 within silicide layers 132A as shown in FIG. 16, and (iv) forming S/D contact plugs 132C on passivation layers 132B and within trenches 1570 as shown in FIG. 18. In some embodiments, the operations of (ii) selectively forming passivation layers 132B and (iii) forming trenches 1570 can be performed simultaneously.

Referring to FIG. 12, the process for forming silicide layer 132A can include depositing a metal layer on base 1162b (shown in FIG. 11) of S/D contact openings 1162 by ALD or CVD, followed by rapid thermal annealing at a temperature in a range from about 700° C. to about 900° C. In some embodiments, the metal layer can include Co, Ni, Ti, W, Mo, Ti, NiCo alloy, Pt, NiPt alloy, Ir, PtIr alloy, Er, Yb, Pd, Rh, Nb, TiSiN, other refractory metals, or a combination thereof.

Figure 15:
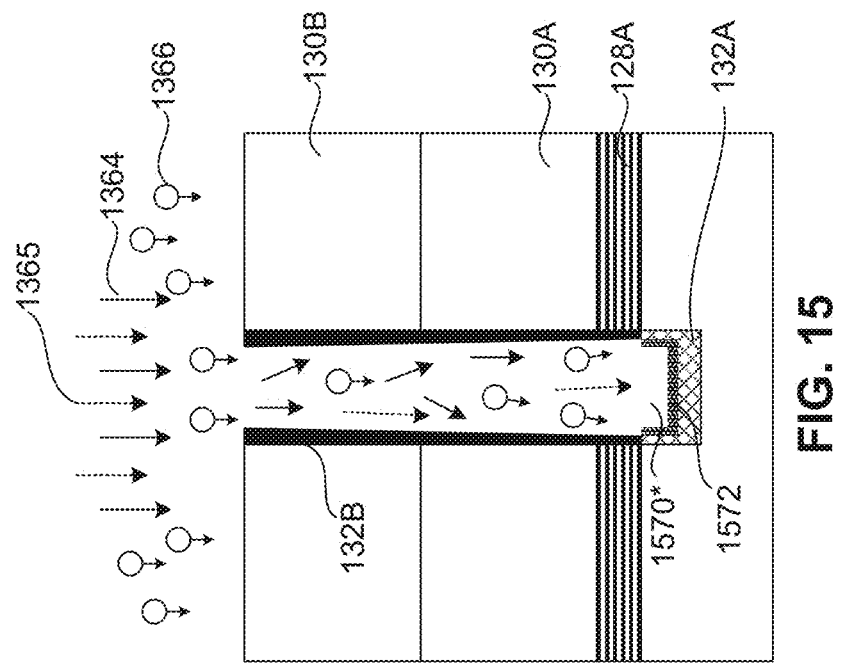

The process for forming silicide layers 132A can be followed by selectively forming passivation layers 132B (shown in FIGS. 14-15, 17, and 18A-18F). Referring to FIGS. 13-16, the process for selectively forming passivation layers 132B can include (i) simultaneously introducing one or more passivation gases 1364, plasma gases 1365, and etching gases 1366 on the structure of FIG. 12, (ii) cleaning sidewalls 130As-130Bs and top surfaces 132As with one or more plasma gases 1365 (iii) oxidizing portions $132A_{ox}$ of silicide layers 132A, (iv) forming passivation layers 132B* (also referred to as "passivation process"), and (v) selectively removing portions 132Bt* and 132Bb* from top surfaces of ILD layer 130B and oxidized portions $132A_{ox}$. The trenches 1570* and/or 1570 can be formed during the selective removal of portions 132Bt* and 132Bb* as shown in FIGS. 15-16 or can be formed after the selective removal of portions 132Bt* and 132Bb*.

In some embodiments, one or more passivation gases 1364, plasma gases 1365, and etching gases 1366 can be introduced sequentially (not shown) and the cleaning, passivation, and trench formation processes can be performed sequentially in the order of (i) cleaning, passivation, and trench formation; (ii) trench formation, cleaning, passivation, and cleaning; or (iii) cleaning, trench formation, passivating, and cleaning. In some embodiments, the passivation, trench formation, and cleaning processes can be performed sequentially in any order and in any number of cycles. In some embodiments, the oxidizing process can be performed sequentially or simultaneously with the cleaning process or the passivation process. In some embodiments, the oxidizing process can be performed prior to the passivation process.

The cleaning and/or oxidizing processes can include flowing a plasma of Ar, He, $N_2$, $O_2$, $O_3$, and/or $H_2$ generated using a remote plasma source (RPS), a capacitively coupled plasma (CCP) generator, an inductively coupled plasma (ICP) generator with a power of about 10 W to about 1500 W (e.g., about 10 W, about 100 W, about 500 W, about 800 W, about 1200 W, or about 1500 W). The cleaning process can remove residual organic material before, after, or during the passivation process, the selective removal of portions 132Bt* and 132Bb* and oxidized portions $132A_{ox}$, and/or the trench formation process.

The passivation process can include simultaneous deposition and etching of passivation material of passivation layers 132B* using passivation gases 1364 and etching gases 1366, respectively. The discussion of passivation material composition of passivation layer 132B can apply to the material composition of passivation layers 132B*. Even though deposition rate of the passivation material is substantially constant on the structure of FIG. 13, portions 132B is thicker than portions 132Bt* and 132Bb* of passivation layers 132B* due to lower etch rate of the passivation material along sidewalls 130As and 130Bs compared to that on top surfaces of ILD layer 130B and oxidized portions $132A_{ox}$. The etch rates are higher on top surfaces of ILD layer 130B and oxidized portions $132A_{ox}$ compared to that along sidewalls 130A and 130B due to the directionality provided by the one or more plasma gases 1365 to the one or more etching gases 1366. In some embodiments, the thickness of passivation layers 132B (shown in FIGS. 14-16) varies along sidewalls 130A and 130B due to different etch rates along sidewalls 130A and 130B as illustrated in FIG. 17. FIG. 17 also illustrates that deposition rate of the passivation material of passivation layer 132B along sidewalls 130A and 130B is substantially constant.

FIG. 15 shows the selective removal of portions 132Bt* and 132Bb* from top surfaces of ILD layer 130B and oxidized portions $132A_{ox}$ using etching gases 1366 after the formation of passivation layers 132B*. Due to the higher etch rates on top surfaces of ILD layer 130B and oxidized portions $132A_{ox}$ compared to that along sidewalls 130A and 130B, portions 132Bt* and 132Bb* can be selectively removed. During or after the selective removal of portions 132Bt* and 132Bb*, trench 1570 can be formed within silicide layer 132A as shown in FIG. 16. In some embodiments, formation of trench 1570 can include (i) forming trench 1570* within silicide layer 132A using etching gases 1366 as shown in FIG. 15, (ii) forming residual layer 1572 within trench 1570* during the formation of trench 1570*, and (iii) etching residual layer 1572 with etching gases 1366. Residual layer 1572 can include byproducts produced during etching of silicide layer 132A with etching gases 1366. In some embodiments, residual layer 1572 is not formed during formation of trench 1570.

Figure 14:
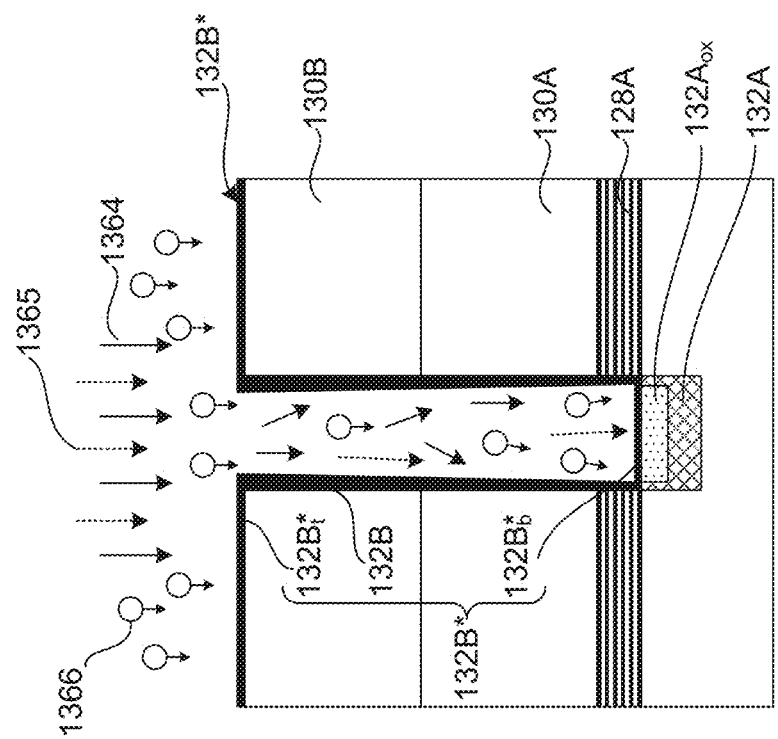

In some embodiments, one or more passivation gases 1364 can include $N_2$, $O_2$, $CHF_3$, a gas mixture of $CF_4$ and $H_2$, fluorine-based (F-based) or Cl-based polymer gases, or a combination thereof. Passivation gases 1364 can be introduced into S/D contact openings 1162 at a flow rate of about 1 standard cubic cm (sccm) to about 5000 sccm (e.g., about 1 sccm, about 100 sccm, about 500 sccm, about 700 sccm, about 1000 sccm, about 3000 sccm, or about 5000 sccm) and at a temperature ranging from about 200° C. to about 450° C. Passivation gases 1364 can react with the dielectric material of ILD layers 130A-130B and/or etching gases 1366 introduced into S/D contact openings 1162 to form passivation layers 132B on sidewalls 130As-130Bs. In some embodiments, passivation gases 1364 can also react with silicide layers 132A and/or oxides (e.g., native oxides) on top surfaces 132As to form portions 132Bb* as shown in FIG. 14.

In some embodiments, one or more etching gases 1366 can include $SF_6$, $WF_6$, $Cl_2$, $NF_3$, $ClF_3$, $BCl_3$, $C_2F_6$, $CCl_2$, $Cl_2$, $CCl_4$, $CF_2Cl_2$, $CF_3Br$, $SiCl_4$, HBr, HI, $XeF_2$, or a combination thereof. Plasma gases 1365 can provide directionality to etching gases 1366 for anisotropic and selective etching of oxidized portions $132A_{ox}$ and/or portions 132Bt* and 132Bb*. The anisotropic and selective etching can prevent substantial etching of passivation layers 132B formed on sidewalls 130As-130Bs. In some embodiments, the selective etching process can be an atomic layer etching process. Etching gases 1366 can be introduced into S/D contact openings 1162 at a flow rate of 1 sccm to about 5000 sccm (e.g., about 1 sccm, about 100 sccm, about 500 sccm, about 700 sccm, about 1000 sccm, about 3000 sccm, or about 5000 sccm), at a temperature ranging from about −100° C. to about 400° C. (e.g., about −100° C., about −50° C., about 0° C., about 25° C., about 50° C., about 70° C., or about 100° C.), and at a pressure ranging from about 0.01 mTorr to about 6 Torr (e.g., about 0.01 mTorr, about 0.5 mTorr, about 10 mTorr, about 100 mTorr, about 500 mTorr, about 1 Torr, about 4 Torr, or about 6 Torr). The plasma can be generated using a remote plasma source (RPS), a capacitively coupled plasma (CCP) generator, or an inductively coupled plasma (ICP) generator with a power of about 10 W to about 1500 W (e.g., about 10 W, about 100 W, about 500 W, about 800 W, about 1200 W, or about 1500 W).

In some embodiments, the formation of passivation layers 132B and trenches 1570 can include the following reactions (1)-(5), where M represents a metallic material of silicide layers 132A:

$$M + \text{plasma gas (e.g. } O_2 \text{ or } O_3) \rightarrow MO_x + O_2 \quad (1)$$

$$\text{F-based polymer gas (e.g., } CF_4, CHF_3, \text{ or } C_4F_8) + \text{plasma gas (e.g., } (N_2, O_2, \text{ or Ar}) \rightarrow \text{carbon (C)} + \text{reactive F ions} \quad (2)$$

$$MO_x + \text{Cl-based etching gas (e.g., } BCl_3) \rightarrow MO_xCl_y + \text{byproduct (e.g., } B_2O_3) \quad (3)$$

$$MO_x + \text{reactive F ions} \rightarrow MO_xF_y \quad (4)$$

$$\text{byproduct (e.g., } B_2O_3) + HF \rightarrow \text{fluoride gas (e.g., } B_2F_3) + H_2O \quad (5)$$

In the above reactions (1)-(5), the F-based polymer gas can be one of passivation gases 1364, the plasma gas can be one of plasma gases 1365, the Cl-based etching gas can be one of etching gases 1366, the C product can form passivation layer 132B, the $MO_x$ product form oxidized portion $132A_{ox}$, and the byproduct can form residual layer 1572. The formation of reaction F ions can help with faster etching of $MO_x$ to form volatile $MO_xF_y$ compound. In some embodiments, reactions (1)-(2) can occur simultaneously or sequentially and reactions (3)-(5) can result in the formation of trench 1570.

In some embodiments, the formation of passivation layers 132B and trenches 1570 can include the following reactions (6)-(10), where M represents a metallic material of silicide layers 132A:

$$M + \text{plasma gas (e.g. } O_2 \text{ or } O_3) \rightarrow MO_x + O_2 \quad (6)$$

$$\text{F-based polymer gas (e.g., } CF_4, CHF_3, \text{ or } C_4F_8) + \text{plasma gas (e.g., } (N_2, O_2, \text{ or Ar}) \rightarrow C + \text{reactive F ions} \quad (7)$$

$$\text{F-based etching gas (e.g., } SF_6, WF_6, \text{ or } NF_6) + \text{plasma gas (e.g., } (N_2, O_2, \text{ or Ar}) \rightarrow \text{byproduct} + \text{reactive F ions} \quad (8)$$

$$MO_x + \text{F-based etching gas (e.g., } SF_6, WF_6, \text{ or } NF_6) \rightarrow MO_xF_y + \text{byproduct} \quad (9)$$

$$MO_x + \text{reactive F ions} \rightarrow MO_xF_y \quad (10)$$

In the above reactions (6)-(10), the F-based polymer gas can be one of passivation gases 1364, the plasma gas can be one of plasma gases 1365, the F-based etching gas can be one of etching gases 1366, the C product can form passivation layer 132B, and the $MO_x$ product form oxidized portion $132A_{ox}$. Residual layer 1572 may not be formed during reactions (6)-(10). The formation of reaction F ions can help with faster etching of $MO_x$ to form volatile $MO_xF_y$ compound. In some embodiments, reactions (6)-(7) can occur simultaneously or sequentially and reactions (8)-(10) can result in the formation of trench 1570.

The passivation material composition of passivation layers 132B can depend on the one or more passivation gases 1364 and etching gases 1366 and/or on the dielectric material of ILD layers 130A-130B. When oxygen-containing passivation gases 1364 and fluorine-containing etching gases 1366 (e.g., $SF_6$, $WF_6$, $NF_3$, mixture of $NF_3$ and HF, or $ClF_3$) are used for the respective passivation and trench formation processes, passivation layers 132B can include an oxygen-rich material composition. The oxygen-rich material composition can include (i) oxygen concentration in a range from about 1 atomic percent to about 50 atomic percent (e.g., about 1 atomic percent, about 5 atomic percent, about 10 atomic percent, about 25 atomic percent, or about 50 atomic percent), (ii) nitrogen concentration in a range from about 2 atomic percent to about 20 atomic percent (e.g., about 2 atomic percent, about 5 atomic percent, about 10 atomic percent, about 15 atomic percent, or about 20 atomic percent), and (iii) fluorine concentration in a range from about 1 atomic percent to about 20 atomic percent (e.g., about 1 atomic percent, about 5 atomic percent, about 10 atomic percent, about 15 atomic percent, or about 20 atomic percent). In some embodiments, the oxygen-rich material composition can include SiNzOxFy or [A]OxFy, where [A] can be elements of ILD layers 130A and/or 130B, such as Si, SiC, metal oxides (e.g., aluminum oxide ($Al2O3$) or magnesium oxide ($MgO_2$)), or nitrides (e.g., aluminum nitride (AlN) or SiN).

When carbon-containing passivation gases 1364 (e.g., $CHF_3$, $C_4F_8$, or $CF_4$) and etching gases 1366, such as $SF_6$, $WF_6$, $Cl_2$, $NF_3$, $ClF_3$, $BCl_3$, $C_2F_6$, $CCl_2$, $Cl_2$, $CCl_4$, $CF_2Cl_2$, $CF_3Br$, $SiCl_4$, HBr, HI, or $XeF_2$, are used for the passivation and trench formation processes, passivation layers 132B can include a carbon-rich material composition. The carbon-rich material composition can include (i) carbon concentration in a range from about 1 atomic percent to about 70 atomic percent (e.g., about 1 atomic percent, about 5 atomic percent, about 15 atomic percent, about 25 atomic percent, about 45 atomic percent, about 50 atomic percent, or about 70 atomic percent), (ii) fluorine concentration in a range from about 1 atomic percent to about 20 atomic percent (e.g., about 1 atomic percent, about 5 atomic percent, about 10 atomic percent, about 15 atomic percent, or about 20 atomic percent), (iii) oxygen concentration in a range from about 1 atomic percent to about 50 atomic percent (e.g., about 1 atomic percent, about 5 atomic percent, about 10 atomic percent, about 25 atomic percent, or about 50 atomic percent), (iv) nitrogen concentration in a range from about 2 atomic percent to about 20 atomic percent (e.g., about 2 atomic percent, about 5 atomic percent, about 10 atomic percent, about 15 atomic percent, or about 20 atomic percent), and traces of hydrogen.

When nitrogen-containing passivation gases 1364 (e.g., $NH_3$, $N_2O$, or $N_2$) are used for the passivation process, passivation layers 132B can include a nitrogen-rich material composition including nitrogen concentration in a range from about 20 atomic percent to about 80 atomic percent (e.g., about 20 atomic percent, about 40 atomic percent, about 60 atomic percent, or about 80 atomic percent).

In some embodiments, a process for depositing a metal layer can be performed on sidewalls 130As-130Bs prior to the passivation, trench formation, and cleaning processes to form layers of metal oxide, metal carbide, or metal nitride on sidewalls 130As-130Bs. The layers of metal oxide, metal carbide, or metal nitride on sidewalls 130As-130Bs can inhibit the deposition of S/D contact plug materials on sidewalls 130As-130Bs. The layers of metal oxide, metal carbide, or metal nitride on sidewalls 130As-130Bs can include respective oxides, carbides, or nitrides of W, Mo, Ir, Pt, Os, Ti, Ni, Ta, TiN, or TaN.

Figure 13:
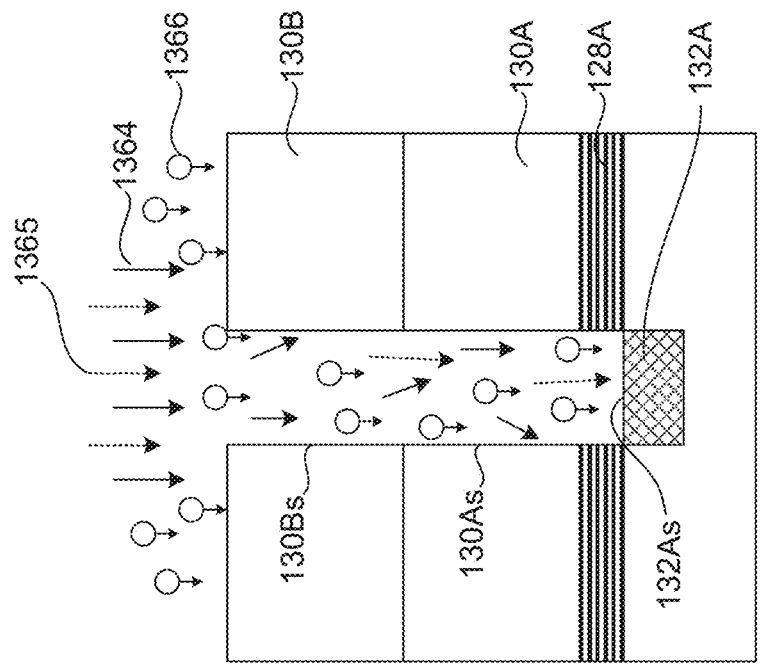
FIGS. 12-16 illustrate cross-sectional views of a source/drain contact structure at various stages of its fabrication process, in accordance with some embodiments.

The passivation and trench formation processes can modify the structure of S/D contact openings 1162 of FIG. 12-13 to have sloped sidewalls 130As-130Bs as shown in FIG. 18. FIG. 18 illustrates finFET 100 after forming S/D contact plugs 132C within S/D contact openings 1162 modified after the passivation and trench formation processes. In some embodiments, sidewall portions $132C_1$ can have a greater sidewall slope than the sidewall slope of the remaining sidewall portions. The passivation and trench formation processes can form other modified structures of S/D contact openings 1162 besides that shown in FIG. 14. For example, FIGS. 19A-19F illustrate enlarged views of finFET region 101 of FIG. 1B with different structural configurations of S/D contact openings 1162 formed after the passivation and trench formation processes. The different structural configurations shown in FIGS. 19A-19F can be based on the different process parameters of the passivation and trench formation processes.

For example, compared to the modified S/D contact openings of FIG. 18 that is filled with S/D contact plugs 132C, the modified S/D contact opening 1162\* of FIG. 19A has portion 132A$_1$ extending into silicide layer 132A along an X-axis under ESL 128A and along a Z-axis. This extended portion 132CA$_1$ can be formed in silicide layer 132A during the forming of passivation layers 132B of FIG. 19A due to higher etching gas 1366 to passivation gas 1364 ratio (e.g., about 5:1) and longer etching time compared to etching gas 1366 to passivation gas 1364 ratio (e.g., about 1:1) and etching time used for the forming of passivation layers 132B of FIG. 14. The higher etching gas 1366 to passivation gas 1364 ratio can cause isotropic etching of silicide layer 132A of FIG. 19A compared to anisotropic etching of silicide layers 132A of FIG. 18. For similar etching gas 1366 to passivation gas 1364 ratio (e.g., 1:1), but longer etching time used for the forming of passivation layers 132B of FIG. 19B compared to that used for the forming of passivation layers 132B of FIG. 18, portion 132A$_2$ of FIG. 19B can extend along a Z-axis without extending along an X-axis under ESL 128A. Portion 132A$_2$ can extend deeper into silicide layer 132A than portion 132A$_1$ due to longer etching time.

In some embodiments, the different sidewall profiles of sidewalls 130A-130B as shown in FIGS. 19A-19F can be due to different processing parameters (e.g., power) of plasma used with etching gases 1366 during the removal process.

Referring back to FIG. 18, the process for forming passivation layers 132B can be followed by forming S/D contact plugs 132C. The process for forming S/D contact plugs 132C can include bottom-up depositing a layer of conductive material including Ru, Ir, Ni, Os, Rh, Al, Mo, W, Co Al, or Cu, followed by a CMP process to substantially coplanarize top surfaces of S/D contact plugs 132C and ILD layer 130B with each other. The conductive material can have a higher deposition selectivity for silicide layers 132A than passivation layers 132B, thus resulting in the bottom-up deposition of the conductive material. In some embodiments, the conductive material can have low resistivity of about 50 µΩ-cm, about 40 µΩ-cm, about 30 µΩ-cm, about 20 µΩ-cm, or about 10 µΩ-cm). In some embodiments, the bottom-up depositing can include using a thermal CVD process, an ALD process, a pulsed mode CVD process, or a plasma enhanced CVD process with a precursor gas of the conductive material, one or more carrier gases (e.g., Ar, CO, or N$_2$), and one or more reaction gases (e.g., H$_2$, O$_2$, or CO). Each of the carrier and reaction gas can be supplied with a flow rate of about 10 sccm to about 500 sccm (e.g., 10 sccm, about 100 sccm, about 200 sccm, or about 500 sccm).

The bottom-up depositing can further include depositing the layer of conductive material at a temperature ranging from about 50° C. to about 500° C. (e.g., about 50° C., about 100° C., about 200° C., about 300° C., or about 500° C.) and at a power of about 0.1 mTorr to about 5 Torr (e.g., about 0.1 mTorr, about 0.5 mTorr, about 10 mTorr, about 100 mTorr, about 500 mTorr, about 2 Torr, or about 5 Torr). In some embodiments, the precursor gas can include Ruthenium, tricarbonyl[(1,2,4,5-.eta.)-1-methyl-1,4-cyclohexadiene] (C$_{10}$H$_{10}$O$_3$Ru), (η6-benzene)((η6-benzene)(η4-1,3-cyclohexadiene) ruthenium (Ru(C6H6)(C6H8)), Ruthenium(III) acetylacetonate 1,3-cyclohexadiene (Ru(C$_5$H$_7$O$_2$)$_3$), (tricarbonyl) ruthenium(0) (Ru(CO)$_3$(C$_6$H$_8$)), Bis(ethylcyclopentadienyl) Ruthenium(II) (Ru(C$_5$H$_4$C$_2$H$_5$)$_2$); Ruthenium pentacarbonyl (Ru(CO)$_5$), or Triruthenium dodecacarbonyl (Ru$_3$(CO)$_{12}$).

Referring to FIG. 3, in operation 330, gate contact structures are formed on the gate structure and via structures are formed on the S/D contact structures. For example, as described with reference to FIGS. 1B and 17, gate contact structure 133 (FIG. 14) can be formed on gate structure 108 and via structures 134 (FIG. 1B) can formed on S/D contact structures 132. The process for forming gate contact structure 133 can include (i) forming a gate contact opening (not shown) through ILD layers 130B-130C and ESL 128B, (ii) forming passivation layers 133A, and (iii) forming gate contact plugs 133B. The above discussion of etching ESL 128A and ILD layers 130A-130B for forming S/D contact openings 1162 applies to the respective etching of ESL 128B and ILD layers 130B-130C for forming gate contact opening. The above discussion of forming passivation layers 132B and S/D contact plugs 132C within S/D contact openings 1162 applies to the forming of passivation layers 133A and gate contact plug 133B, respectively, unless mentioned otherwise.

Unlike the trench formation process during forming passivation layers 132B, the trench formation process during forming passivation layer 133A can selectively etch oxides and/or passivation layer from top surface of gate structure 108 to form a trench similar to trench 1570 within gate structure 108. Also, unlike the forming of passivation layers 132B, passivation gases similar to passivation gases 1364 used in the forming of passivation layer 133A can react with the dielectric material of ILD layers 130B-130C and/or etching gases introduced into gate contact opening to form passivation layer 133A on sidewalls 130Bs-130Cs and 128Bs. Further, unlike the forming of S/D contact plugs 132C, the process for forming gate contact plugs 133B can include bottom-up depositing a layer of conductive material including Ru, Ir, Ni, Os, Rh, Al, Mo, W, Co Al, or Cu, followed by a CMP process to substantially coplanarize top surfaces of gate contact plugs 133B and ILD layer 130C with each other. The conductive material for gate contact plug 133B can have a higher deposition selectivity for gate metal fill layer 124 of gate structure 108 than passivation layer 133B, thus resulting in the bottom-up deposition of the conductive material.

The process for forming gate contact structure 133 can be followed by forming via structures 134 as shown in FIG. 1B. The process for forming via structures 134 can include (i) forming via openings 1468 (FIG. 14) on S/D contact structures 132 through ILD layer 130C and ESL 128B, (ii) forming passivation layers 134A, and (iii) forming via plugs 134B. The above discussion of etching ESL 128A and ILD layers 130A-130B for forming S/D contact openings 1162 applies to the respective etching of ESL 128B and ILD layer 130C for forming via openings 1468. The above discussion of forming passivation layers 132B and S/D contact plugs 132C within S/D contact openings 1162 applies to the forming of passivation layers 134A and via plugs 134B, respectively, unless mentioned otherwise.

Unlike the trench formation process during forming passivation layers 132B, the trench formation process during forming passivation layer 134A can selectively etch oxides and/or passivation layer from top surface of S/D contact plugs 132C to form trenches similar to 1570 within S/D contact plugs 132C. Also, unlike the forming of passivation layers 132B, passivation gases similar to passivation gases 1364 used in the forming of passivation layer 134A can react with the dielectric material of ILD layer 130C and/or etching gases introduced into via openings 1468 to form passivation layer 134A on sidewalls 130Cs and 128Bs. Further, unlike the forming of S/D contact plugs 132C, the process for forming via plugs 134B can include bottom-up depositing a layer of conductive material including Co, Cu, Ru, Ni, Al, Pt, Mo, W, Al, Ir, or Os, followed by a CMP process to substantially coplanarize top surfaces of via contact plugs 132C and ILD layer 130C with each other. The conductive material for via plugs 134B can have a higher deposition selectivity for S/D contact plugs 132C than passivation layers 134B, thus resulting in the bottom-up deposition of the conductive material.

The present disclosure provides example structures and methods for reducing resistivity of contact plugs (e.g., S/D contact plugs 132C) in contact structures (e.g., S/D contact structures 132) and/or via plugs (e.g., via plugs 134B) in via structures (e.g., via structures 134) of FET devices (e.g., finFET 100). The reduction of contact and/or via plug resistivity in FET devices can reduce the contact resistance between S/D regions (e.g., S/D regions 105), S/D contact structures, and interconnect structures, thus resulting in higher drive currents in the FET devices with improved FET device performance.

The example structures and methods provide contact structures 132 and via structures 134 with substantially void-free contact plugs 132C and via plugs 134B, respectively. The substantially void-free contact plugs 132C and via plugs 134B can be formed with low resistivity (e.g., resistivity about 50 μΩ-cm, about 40 μΩ-cm, about 30 μΩ-cm, about 20 μΩ-cm, or about 10μΩ-cm) in respective contact openings 1162 and/or via openings 1468 with dimensions (e.g., width or diameter) less than about 20 nm (e.g., about 15 nm, about 12.5 nm, about 10 nm, about 7.5 nm, about 5 nm, or about 2 nm) and with high aspect ratio (e.g., about 10, about 15, about 20, or about 30).

In some embodiments, contact plugs 132C can include low-resistivity metals, such as Ru, Ir, Ni, Os, Rh, Al, Mo, W, Co Al, or Cu. In some embodiments, via plugs 134B can include low-resistivity metals, such as Co, Cu, Ru, Ni, Al, Pt, Mo, W, Al, Ir, or Os. In some embodiments, Ru-based contact plugs 132C and/or via plugs 134B with dimensions less than about 20 nm (e.g., about 15 nm, about 12.5 nm, about 10 nm, about 7.5 nm, about 5 nm, or about 2 nm) can have lower resistivity compared to Cu, W, or Co-based contact plugs 132C and/or via plugs 134B with similar dimensions.

In some embodiments, contact structures 132 and via structures 134 can be formed without metal-based barrier layers along the sidewalls of contact openings 1162 and/or via openings 1468 to reduce contact and/or via plug resistivity, respectively. Barrierless contact structures 132 and via structures 134 can have larger volume for the formation of respective contact plugs 132C and/or via plugs 134B. The larger volume can allow the contact and/or via plugs to have larger cross-sectional areas in the respective contact and/or via structures, which can lead to reduced contact and/or via plug resistivity because resistivity of a material is inversely proportional to the cross-sectional area of the material. Also, the larger cross-sectional areas result in larger contact areas with S/D regions, thus resulting in reduced contact resistance between S/D regions, S/D contact structures, and interconnect structures.

In some embodiments, the method for fabricating the substantially void-free contact plugs 132C and/or via plugs 134B in respective barrierless contact structures 132 and/or via structures 134 can include passivating sidewalls of respective contact openings 1162 and/or via openings 1468 with non-metal-based passivation layers 132B and 134A, respectively. Passivation layers 132C and 134B can inhibit deposition of contact and/or via plug materials along the respective contact and via opening sidewalls and promote their bottom-up deposition. Passivation layers 132B and 134A can also prevent diffusion of the contact and/or via plug materials to adjacent layers. To promote the bottom-up deposition of the contact and/or via plug materials, the method can further include directional etching of metal oxides from surfaces of metal-based layers (e.g., metal silicide layers or S/D contact plugs) on which the contact and/or via plug materials can be deposited. This directional etching of metal oxides can increase the deposition selectivity of the contact and/or via plug materials to these substantially oxide-free metal-based layers than to the contact and via opening sidewalls.

In some embodiments, the substantially void-free contact and via plugs can be formed in contact and via structures with metal-based barrier layers along the sidewalls of contact and via openings, respectively, using the bottom-up deposition process. The method for forming such contact and/or via structures can include forming metal oxides, metal nitrides, and/or metal carbides on the surfaces of the metal-based barrier layers to decrease the deposition selectivity of the contact and/or via plug materials to the contact and/or via opening sidewalls, respectively. Thus, the example methods disclosed herein can form substantially void-free contact plugs 132C and/or via plugs 134B with low resistivity in respective contact structures 132 and/or via structures 134 with or without metal-based barrier layers using the bottom-up deposition process.

In some embodiments, a method for fabricating a semiconductor device includes forming a source/drain (S/D) region on a substrate, forming a S/D contact structure on the S/D region, and forming a via structure on the S/D contact structure. The forming of the S/D contact structure includes forming a S/D contact opening, forming a silicide layer on an exposed surface of the S/D region within the S/D contact opening, providing a mixture of a passivation gas, an etching gas, and a plasma gas, forming a non-metal passivation layer with a first portion on sidewalls of the S/D contact opening and a second portion on the silicide layer, etching the first and second portions of the non-metal passivation layer at first and second etch rates, respectively, wherein the first etch rate is smaller than the second rate, forming a trench in the silicide layer, and depositing a S/D contact plug within the S/D contact opening in a bottom-up deposition process.

In some embodiments, a method for fabricating a semiconductor device includes forming a source/drain (S/D) region on a substrate, forming a S/D contact structure on the S/D region, and forming a via structure on the S/D contact structure. The forming of the via structure includes forming a via opening on the S/D contact structure, forming a non-metal passivation layer with a first portion on sidewalls of the via opening and a second portion on the S/D contact, and depositing a via plug within the via opening in a bottom-up deposition process.

In some embodiments, a semiconductor device includes a fin structure on a substrate, a source/drain (S/D) region the fin structure, a S/D contact structure on the S/D region, and a via structure on the S/D contact structure. The S/D contact structure includes a silicide layer on the S/D region, a S/D contact plug on the silicide layer, and a first non-metal passivation layer on sidewalls of the S/D contact plug.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
    forming a source/drain (S/D) region on a substrate;
    forming a S/D contact structure on the S/D region, wherein the forming the S/D contact structure comprises:
        forming a S/D contact opening,
        forming a silicide layer on an exposed surface of the S/D region within the S/D contact opening,
        providing a mixture of a passivation gas, an etching gas, and a plasma gas,
        forming a non-metal passivation layer with a first portion on sidewalls of the S/D contact opening and a second portion on the silicide layer,
        etching the first and second portions of the non-metal passivation layer at first and second etch rates, respectively, wherein the first etch rate is less than the second etch rate,
        forming a trench in the silicide layer, and
    depositing a S/D contact plug within the S/D contact opening in a bottom-up deposition process; and
    forming a via structure on the S/D contact structure.

2. The method of claim 1, wherein the etching the first portion of the non-metal passivation layer comprises:
    etching a first sub-portion of the first portion at the first etch rate; and
    etching a second sub-portion of the first portion at a third etch rate greater than the first etch rate and less than the second etch rate.

3. The method of claim 1, wherein the forming the non-metal passivation layer comprises forming a carbon-based layer on the sidewalls of the S/D contact opening with the passivation gas having a polymer gas.

4. The method of claim 1, wherein the forming the non-metal passivation layer comprises selectively removing an oxide layer from a surface of the silicide layer with the etching gas and the plasma gas.

5. The method of claim 1, wherein the forming the non-metal passivation layer comprises cleaning the sidewalls of the S/D contact opening and a surface of the silicide layer with the plasma gas.

6. The method of claim 1, wherein the forming the trench comprises:
    oxidizing a portion of the silicide layer with the plasma gas to form an oxidized portion; and
    etching the oxidized portion with the etching gas.

7. The method of claim 1, wherein the forming the S/D contact structure comprises:
    simultaneously forming the non-metal passivation layer on the sidewalls of the S/D contact opening with the passivation gas and forming the trench with the etching gas and the plasma gas.

8. The method of claim 1, wherein the forming the S/D contact structure comprises:
    forming the trench with the etching gas and the plasma gas after forming the non-metal passivation layer on the sidewalls of the S/D contact opening with a passivation gas.

9. The method of claim 1, wherein the forming the non-metal passivation layer comprises forming a passivation layer with a higher concentration of carbon than oxygen, nitrogen, or fluorine concentrations of the passivation layer.

10. The method of claim 1, wherein the depositing the S/D contact plug comprises depositing a conductive material with a higher deposition selectivity for the silicide layer than that of the non-metal passivation layer.

11. A method, comprising:
    forming an epitaxial source/drain (S/D) region within a substrate;
    forming a dielectric layer on the epitaxial S/D region;
    forming a contact opening within the dielectric layer;
    forming a silicide layer on an exposed surface of the epitaxial S/D region within the contact opening;
    selectively forming a non-metal passivation layer on sidewalls of the contact opening, wherein the selectively forming the non-metal passivation layer comprises depositing a non-metal passivation material at a substantially constant deposition rate and etching the non-metal passivation material at an etch rate that varies along the sidewalls of the contact opening;
    forming a trench in the silicide layer; and
    depositing a contact plug in a bottom-up deposition process to fill the trench and the contact opening.

12. The method of claim 11, wherein the selectively forming the non-metal passivation layer comprises introducing a passivation gas, an etching gas, and a plasma gas into the contact opening at a same time.

13. The method of claim 11, wherein the selectively forming the non-metal passivation layer comprises:
    depositing the non-metal passivation material on the dielectric layer, along the sidewalls of the contact opening, and over the silicide layer; and
    etching the non-metal passivation material from the dielectric layer and the silicide layer at a faster rate than from the sidewalls of the contact opening.

14. The method of claim 11, wherein the forming the trench comprises:
    oxidizing a portion of the silicide layer to form an oxidized portion; and
    etching the oxidized portion.

15. The method of claim 11, wherein the forming the trench in the silicide layer is performed at a same time as the selectively forming the non-metal passivation layer on the sidewalls of the contact opening.

16. The method of claim 11, wherein the forming the trench in the silicide layer is performed after the forming the selectively forming the non-metal passivation layer on the sidewalls of the contact opening.

17. A method, comprising:
    forming a fin structure on a substrate;
    forming an epitaxial source/drain (S/D) region on the fin structure;
    forming a dielectric layer on the epitaxial S/D region;
    forming a contact opening within the dielectric layer;

forming a silicide layer on an exposed surface of the epitaxial S/D region within the contact opening;

selectively forming a non-metal passivation layer on sidewalls of the contact opening;

forming a trench in the silicide layer during the selectively forming the non-metal passivation layer; and forming a contact plug in a bottom-up deposition process to fill the trench and the contact opening.

18. The method of claim 17, wherein the selectively forming the non-metal passivation layer comprises:

depositing a non-metal passivation material along the sidewalls of the contact opening and on an oxidized portion of the silicide layer; and etching the non-metal passivation material from the oxidized portion of the silicide layer at a faster rate than from the sidewalls of the contact opening.

19. The method of claim 17, wherein the selectively forming the non-metal passivation layer comprises introducing a passivation gas, an etching gas, and a plasma gas into the contact opening at a same time.

20. The method of claim 17, wherein the forming the contact plug in the bottom-up deposition process comprises depositing a conductive material with a higher deposition selectivity for the silicide layer than for the non-metal passivation layer.

* * * * *